United States Patent
Oosterlaken et al.

(10) Patent No.: US 10,103,040 B1
(45) Date of Patent: Oct. 16, 2018

(54) APPARATUS AND METHOD FOR MANUFACTURING A SEMICONDUCTOR DEVICE

(71) Applicant: ASM IP Holding B.V., Almere (NL)

(72) Inventors: Theodorus Oosterlaken, Oudewater (NL); Chris de Ridder, Almere (NL); Lucian Jdira, Nieuw Vennep (NL)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/476,035

(22) Filed: Mar. 31, 2017

(51) Int. Cl.
| | |
|---|---|
| *H01L 21/67* | (2006.01) |
| *H01L 21/268* | (2006.01) |
| *H01L 21/324* | (2006.01) |
| *H01S 5/42* | (2006.01) |
| *H01S 5/042* | (2006.01) |

(52) U.S. Cl.
CPC ...... *H01L 21/67115* (2013.01); *H01L 21/268* (2013.01); *H01L 21/324* (2013.01); *H01S 5/042* (2013.01); *H01S 5/423* (2013.01)

(58) Field of Classification Search
CPC ............ H01L 21/324; H01L 31/1864; H01L 51/0027; H01L 21/28176; H01L 31/208; H01L 33/0095; H01L 21/67115; H01L 21/268; H01L 133/0095; H01L 21/67178; H01L 21/67173; H01L 21/67184; H01L 21/6719; H01L 21/67196; H01L 21/67201; H01L 21/67207; H01S 5/042; H01S 5/42; H01S 5/423; H01S 5/426; H01S 5/50; H01S 5/2068
See application file for complete search history.

(56) References Cited

U.S. PATENT DOCUMENTS

| | | |
|---|---|---|
| D56,051 S | 8/1920 | Cohn |
| 2,161,626 A | 6/1939 | Loughner et al. |
| 2,745,640 A | 5/1956 | Cushman |
| 2,990,045 A | 9/1959 | Root |
| 3,089,507 A | 5/1963 | Drake et al. |
| 3,094,396 A | 6/1963 | Flugge et al. |
| 3,232,437 A | 2/1966 | Hultgren |
| 3,647,387 A | 3/1972 | Benson |
| 3,833,492 A | 9/1974 | Bollyky |
| 3,854,443 A | 12/1974 | Baerg |
| 3,862,397 A | 1/1975 | Anderson et al. |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Yasser A Abdelaziez
(74) *Attorney, Agent, or Firm* — Snell & Wilmer L.L.P.

(57) ABSTRACT

The invention relates to an apparatus for manufacturing a semiconductor device comprising a reaction chamber comprising a substrate holder for holding a substrate; and, a heater for heating the substrate. The heater may comprise a vertical cavity surface emitting laser constructed and arranged to emit a radiation beam to a substrate held by the substrate holder to heat the substrate.

23 Claims, 5 Drawing Sheets

(56) References Cited

U.S. PATENT DOCUMENTS

| | | |
|---|---|---|
| 3,887,790 A | 6/1975 | Ferguson |
| 3,904,371 A | 9/1975 | Neti |
| 3,913,617 A | 10/1975 | van Laar |
| 4,054,071 A | 10/1977 | Patejak |
| 4,058,430 A | 11/1977 | Suntola et al. |
| 4,134,425 A | 1/1979 | Gussefeld et al. |
| 4,145,699 A | 3/1979 | Hu et al. |
| 4,164,959 A | 8/1979 | Wurzburger |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,333,735 A | 6/1982 | Hardy |
| 4,389,973 A | 6/1983 | Suntola et al. |
| 4,393,013 A | 7/1983 | McMenamin |
| 4,401,507 A | 8/1983 | Engle |
| 4,414,492 A | 11/1983 | Hanlet |
| 4,436,674 A | 3/1984 | McMenamin |
| 4,479,831 A | 10/1984 | Sandow |
| 4,499,354 A | 2/1985 | Hill et al. |
| 4,512,113 A | 4/1985 | Budinger |
| 4,548,688 A | 10/1985 | Mathews |
| 4,570,328 A | 2/1986 | Price et al. |
| 4,575,636 A | 3/1986 | Caprari |
| 4,579,623 A | 4/1986 | Suzuki et al. |
| D288,556 S | 3/1987 | Wallgren |
| 4,653,541 A | 3/1987 | Oehlschlaeger et al. |
| 4,654,226 A | 3/1987 | Jackson et al. |
| 4,664,769 A | 5/1987 | Cuomo et al. |
| 4,681,134 A | 7/1987 | Paris |
| 4,718,637 A | 1/1988 | Contin |
| 4,722,298 A | 2/1988 | Rubin et al. |
| 4,735,259 A | 4/1988 | Vincent |
| 4,753,192 A | 6/1988 | Goldsmith et al. |
| 4,756,794 A | 7/1988 | Yoder |
| 4,780,169 A | 10/1988 | Stark et al. |
| 4,789,294 A | 12/1988 | Sato et al. |
| 4,821,674 A | 4/1989 | deBoer et al. |
| 4,827,430 A | 5/1989 | Aid et al. |
| 4,837,113 A | 6/1989 | Luttmer et al. |
| 4,837,185 A | 6/1989 | Yau et al. |
| 4,854,263 A | 8/1989 | Chang et al. |
| 4,857,137 A | 8/1989 | Tashiro et al. |
| 4,857,382 A | 8/1989 | Sheng et al. |
| 4,882,199 A | 11/1989 | Sadoway et al. |
| 4,916,091 A | 4/1990 | Freeman et al. |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,856 A | 1/1991 | Hey |
| 4,991,614 A | 2/1991 | Hammel |
| 5,013,691 A | 5/1991 | Lory et al. |
| 5,027,746 A | 7/1991 | Frijlink |
| 5,028,366 A | 7/1991 | Harakal et al. |
| 5,057,436 A | 10/1991 | Ball |
| 5,060,322 A | 10/1991 | Delepine |
| 5,062,386 A | 11/1991 | Christensen |
| 5,065,698 A | 11/1991 | Koike |
| 5,074,017 A | 12/1991 | Toya et al. |
| 5,098,638 A | 3/1992 | Sawada |
| 5,104,514 A | 4/1992 | Quartarone |
| 5,116,018 A | 5/1992 | Friemoth et al. |
| D327,534 S | 6/1992 | Manville |
| 5,119,760 A | 6/1992 | McMillan et al. |
| 5,130,003 A | 7/1992 | Conrad |
| 5,167,716 A | 12/1992 | Boitnott et al. |
| 5,178,682 A | 1/1993 | Tsukamoto et al. |
| 5,183,511 A | 2/1993 | Yamazaki et al. |
| 5,192,717 A | 3/1993 | Kawakami |
| 5,194,401 A | 3/1993 | Adams et al. |
| 5,199,603 A | 4/1993 | Prescott |
| 5,221,556 A | 6/1993 | Hawkins et al. |
| 5,225,366 A | 7/1993 | Yoder et al. |
| 5,242,539 A | 9/1993 | Kumihashi et al. |
| 5,243,195 A | 9/1993 | Nishi |
| 5,246,500 A | 9/1993 | Samata et al. |
| 5,259,881 A * | 11/1993 | Edwards ............... G01J 5/0003 118/719 |
| 5,266,526 A | 11/1993 | Aoyama |
| 5,271,967 A | 12/1993 | Kramer et al. |
| 5,278,494 A | 1/1994 | Obigane |
| 5,288,684 A | 2/1994 | Yamazaki et al. |
| 5,306,666 A | 4/1994 | Izumi |
| 5,306,946 A | 4/1994 | Yamamoto |
| 5,310,456 A | 5/1994 | Kadomura |
| 5,315,092 A | 5/1994 | Takahashi et al. |
| 5,326,427 A | 7/1994 | Jerbic |
| 5,336,327 A | 8/1994 | Lee |
| 5,354,580 A | 10/1994 | Goela et al. |
| 5,356,478 A | 10/1994 | Chen et al. |
| 5,360,269 A | 11/1994 | Ogawa et al. |
| 5,364,667 A | 11/1994 | Rhieu |
| 5,380,367 A | 1/1995 | Bertone |
| 5,382,311 A | 1/1995 | Ishikawa et al. |
| 5,404,082 A | 4/1995 | Hernandez et al. |
| 5,413,813 A | 5/1995 | Cruse et al. |
| 5,414,221 A | 5/1995 | Gardner |
| 5,415,753 A | 5/1995 | Hurwitt et al. |
| 5,421,893 A | 6/1995 | Perlov |
| 5,422,139 A | 6/1995 | Fischer |
| 5,430,011 A | 7/1995 | Tanaka et al. |
| 5,444,217 A | 8/1995 | Moore |
| 5,453,124 A | 9/1995 | Moslehi et al. |
| 5,494,494 A | 2/1996 | Mizuno et al. |
| 5,496,408 A | 3/1996 | Motoda et al. |
| 5,504,042 A | 4/1996 | Cho et al. |
| 5,518,549 A | 5/1996 | Hellwig |
| 5,527,417 A | 6/1996 | Iida et al. |
| 5,531,835 A | 7/1996 | Fodor et al. |
| 5,540,898 A | 7/1996 | Davidson |
| 5,574,247 A | 11/1996 | Nishitani et al. |
| 5,576,629 A | 11/1996 | Turner |
| 5,577,331 A | 11/1996 | Suzuki |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,604,410 A | 2/1997 | Vollkommer et al. |
| 5,616,947 A | 4/1997 | Tamura |
| 5,621,982 A | 4/1997 | Yamashita |
| 5,632,919 A | 5/1997 | MacCracken et al. |
| D380,527 S | 7/1997 | Velez |
| 5,665,608 A | 9/1997 | Chapple-Sokol et al. |
| 5,679,215 A | 10/1997 | Barnes et al. |
| 5,681,779 A | 10/1997 | Pasch et al. |
| 5,683,517 A | 11/1997 | Shan |
| 5,695,567 A | 12/1997 | Kordina |
| 5,718,574 A | 2/1998 | Shimazu |
| 5,724,748 A | 3/1998 | Brooks |
| 5,728,223 A | 3/1998 | Murakarni et al. |
| 5,730,801 A | 3/1998 | Tepman et al. |
| 5,732,744 A | 3/1998 | Barr et al. |
| 5,736,314 A | 4/1998 | Hayes et al. |
| 5,777,838 A | 7/1998 | Tamagawa et al. |
| 5,781,693 A | 7/1998 | Balance et al. |
| 5,782,979 A | 7/1998 | Kaneno |
| 5,796,074 A | 8/1998 | Edelstein et al. |
| 5,801,104 A | 9/1998 | Schuegraf et al. |
| 5,819,434 A | 10/1998 | Herchen et al. |
| 5,827,757 A | 10/1998 | Robinson, Jr. et al. |
| 5,836,483 A | 11/1998 | Disel |
| 5,837,320 A | 11/1998 | Hampden-Smith et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,873,942 A | 2/1999 | Park |
| 5,877,095 A | 3/1999 | Tamura et al. |
| D409,894 S | 5/1999 | McClurg |
| 5,908,672 A | 6/1999 | Ryu |
| 5,916,365 A | 6/1999 | Sherman |
| 5,920,798 A | 7/1999 | Higuchi et al. |

(56) References Cited

U.S. PATENT DOCUMENTS

| | | | |
|---|---|---|---|
| 5,937,323 A | 8/1999 | Orczyk et al. | |
| 5,968,275 A | 10/1999 | Lee et al. | |
| 5,975,492 A | 11/1999 | Brenes | |
| 5,979,506 A | 11/1999 | Aarseth | |
| 5,997,588 A | 12/1999 | Goodwin | |
| 5,997,768 A | 12/1999 | Scully | |
| D419,652 S | 1/2000 | Hall et al. | |
| 6,013,553 A | 1/2000 | Wallace | |
| 6,015,465 A | 1/2000 | Kholodenko et al. | |
| 6,017,779 A | 1/2000 | Miyasaka | |
| 6,017,818 A | 1/2000 | Lu | |
| 6,024,799 A | 2/2000 | Chen | |
| 6,035,101 A | 3/2000 | Sajoto et al. | |
| 6,042,652 A | 3/2000 | Hyun | |
| 6,044,860 A | 4/2000 | Nue | |
| 6,048,154 A | 4/2000 | Wytman | |
| 6,050,506 A | 4/2000 | Guo et al. | |
| 6,060,691 A | 5/2000 | Minami et al. | |
| 6,068,441 A | 5/2000 | Raaijmakers et al. | |
| 6,072,163 A | 6/2000 | Armstrong | |
| 6,074,443 A | 6/2000 | Venkatesh | |
| 6,083,321 A | 7/2000 | Lei et al. | |
| 6,086,677 A | 7/2000 | Umotoy et al. | |
| 6,096,267 A | 8/2000 | Kishkovich | |
| 6,099,302 A | 8/2000 | Hong et al. | |
| 6,121,158 A | 9/2000 | Benchikha et al. | |
| 6,122,036 A | 9/2000 | Yamasaki et al. | |
| 6,124,600 A | 9/2000 | Moroishi et al. | |
| 6,125,789 A | 10/2000 | Gupta et al. | |
| 6,126,848 A | 10/2000 | Li et al. | |
| 6,129,044 A | 10/2000 | Zhao et al. | |
| 6,134,807 A | 10/2000 | Komino | |
| 6,137,240 A | 10/2000 | Bogdan et al. | |
| 6,140,252 A | 10/2000 | Cho et al. | |
| 6,148,761 A | 11/2000 | Majewski et al. | |
| 6,160,244 A | 12/2000 | Ohashi | |
| 6,161,500 A | 12/2000 | Kopacz et al. | |
| 6,162,323 A | 12/2000 | Koshimizu et al. | |
| 6,174,809 B1 | 1/2001 | Kang et al. | |
| 6,180,979 B1 | 1/2001 | Hofman et al. | |
| 6,187,691 B1 | 2/2001 | Fukuda | |
| 6,190,634 B1 | 2/2001 | Lieber et al. | |
| 6,191,399 B1 | 2/2001 | Van Bilsen | |
| 6,194,037 B1 | 2/2001 | Terasaki et al. | |
| 6,201,999 B1 | 3/2001 | Jevtic | |
| 6,207,932 B1 | 3/2001 | Yoo | |
| 6,212,789 B1 | 4/2001 | Kato | |
| 6,217,658 B1 | 4/2001 | Orczyk et al. | |
| 6,218,288 B1 | 4/2001 | Li et al. | |
| 6,242,359 B1 | 6/2001 | Misra | |
| 6,250,250 B1 | 6/2001 | Maishev et al. | |
| 6,271,148 B1 | 8/2001 | Kao | |
| 6,274,878 B1 | 8/2001 | Li et al. | |
| 6,281,098 B1 | 8/2001 | Wang | |
| 6,284,050 B1 | 9/2001 | Shi et al. | |
| 6,287,965 B1 | 9/2001 | Kang et al. | |
| D449,873 S | 10/2001 | Bronson | |
| 6,296,909 B1 | 10/2001 | Spitsberg | |
| 6,299,133 B2 | 10/2001 | Waragai et al. | |
| 6,302,964 B1 | 10/2001 | Umotoy et al. | |
| 6,303,523 B2 | 10/2001 | Cheung | |
| 6,305,898 B1 | 10/2001 | Yamagishi et al. | |
| 6,312,525 B1 | 11/2001 | Bright et al. | |
| 6,315,512 B1 | 11/2001 | Tabrizi et al. | |
| D451,893 S | 12/2001 | Robson | |
| D452,220 S | 12/2001 | Robson | |
| 6,325,858 B1 | 12/2001 | Wengert | |
| 6,326,597 B1 | 12/2001 | Lubomirsky et al. | |
| 6,329,297 B1 | 12/2001 | Balish | |
| 6,342,427 B1 | 1/2002 | Choi et al. | |
| 6,344,084 B1 * | 2/2002 | Koinuma | B01J 19/0046 117/108 |
| 6,347,636 B1 | 2/2002 | Xia | |
| 6,352,945 B1 | 3/2002 | Matsuki | |
| 6,367,410 B1 | 4/2002 | Leahey et al. | |
| 6,368,987 B1 | 4/2002 | Kopacz et al. | |
| 6,370,796 B1 | 4/2002 | Zucker | |
| 6,372,583 B1 | 4/2002 | Tyagi | |
| 6,374,831 B1 | 4/2002 | Chandran | |
| 6,375,312 B1 | 4/2002 | Ikeda et al. | |
| D457,609 S | 5/2002 | Piano | |
| 6,383,566 B1 | 5/2002 | Zagdoun | |
| 6,383,955 B1 | 5/2002 | Matsuki | |
| 6,387,207 B1 | 5/2002 | Janakiraman | |
| 6,391,803 B1 | 5/2002 | Kim et al. | |
| 6,395,650 B1 | 5/2002 | Callegari et al. | |
| 6,398,184 B1 | 6/2002 | Sowada et al. | |
| 6,410,459 B2 | 6/2002 | Blalock et al. | |
| 6,413,321 B1 | 7/2002 | Kim et al. | |
| 6,413,583 B1 | 7/2002 | Moghadam et al. | |
| 6,420,279 B1 | 7/2002 | Ono et al. | |
| D461,233 S | 8/2002 | Whalen | |
| D461,882 S | 8/2002 | Piano | |
| 6,435,798 B1 | 8/2002 | Satoh | |
| 6,436,819 B1 | 8/2002 | Zhang | |
| 6,437,444 B2 | 8/2002 | Andideh | |
| 6,445,574 B1 | 9/2002 | Saw et al. | |
| 6,446,573 B2 | 9/2002 | Hirayama et al. | |
| 6,447,651 B1 | 9/2002 | Ishikawa et al. | |
| 6,448,192 B1 | 9/2002 | Kaushik | |
| 6,450,757 B1 | 9/2002 | Saeki | |
| 6,451,713 B1 | 9/2002 | Tay et al. | |
| 6,454,860 B2 | 9/2002 | Metzner et al. | |
| 6,455,445 B2 | 9/2002 | Matsuki | |
| 6,461,435 B1 | 10/2002 | Littau et al. | |
| 6,468,924 B2 | 10/2002 | Lee | |
| 6,472,266 B1 | 10/2002 | Yu et al. | |
| 6,475,276 B1 | 11/2002 | Elers et al. | |
| 6,475,930 B1 | 11/2002 | Junker et al. | |
| 6,478,872 B1 | 11/2002 | Chae et al. | |
| 6,482,331 B2 | 11/2002 | Lu et al. | |
| 6,482,663 B1 | 11/2002 | Buckland | |
| 6,483,989 B1 | 11/2002 | Okada et al. | |
| 6,494,065 B2 | 12/2002 | Babbitt | |
| 6,499,533 B2 | 12/2002 | Yamada | |
| 6,503,562 B1 | 1/2003 | Saito et al. | |
| 6,503,826 B1 | 1/2003 | Oda | |
| 6,506,253 B2 | 1/2003 | Sakuma | |
| 6,511,539 B1 | 1/2003 | Raaijmakers | |
| 6,514,313 B1 | 2/2003 | Spiegelman | |
| 6,521,295 B1 | 2/2003 | Remington | |
| 6,521,547 B1 | 2/2003 | Chang et al. | |
| 6,528,430 B2 | 3/2003 | Kwan | |
| 6,528,767 B2 | 3/2003 | Bagley et al. | |
| 6,531,193 B2 | 3/2003 | Fonash et al. | |
| 6,531,412 B2 | 3/2003 | Conti et al. | |
| 6,534,395 B2 | 3/2003 | Werkhoven et al. | |
| 6,544,906 B2 | 4/2003 | Rotondaro et al. | |
| 6,552,209 B1 | 4/2003 | Lei et al. | |
| 6,558,755 B2 | 5/2003 | Berry et al. | |
| 6,566,278 B1 | 5/2003 | Harvey et al. | |
| 6,569,239 B2 | 5/2003 | Arai et al. | |
| 6,573,030 B1 | 6/2003 | Fairbairn et al. | |
| 6,576,062 B2 | 6/2003 | Matsuse | |
| 6,576,064 B2 | 6/2003 | Griffiths et al. | |
| 6,576,300 B1 | 6/2003 | Berry et al. | |
| 6,576,564 B2 | 6/2003 | Agarwal | |
| 6,578,589 B1 | 6/2003 | Mayusumi | |
| 6,579,833 B1 | 6/2003 | McNallan et al. | |
| 6,583,048 B1 | 6/2003 | Vincent et al. | |
| 6,589,868 B2 | 7/2003 | Rossman | |
| 6,590,251 B2 | 7/2003 | Kang et al. | |
| 6,594,550 B1 | 7/2003 | Okrah | |
| 6,596,653 B2 | 7/2003 | Tan | |
| 6,598,559 B1 | 7/2003 | Vellore et al. | |
| 6,620,251 B2 | 9/2003 | Kitano | |
| 6,624,064 B1 | 9/2003 | Sahin | |
| 6,627,268 B1 | 9/2003 | Fair et al. | |
| 6,627,503 B2 | 9/2003 | Ma et al. | |
| 6,632,478 B2 | 10/2003 | Gaillard et al. | |
| 6,633,364 B2 | 10/2003 | Hayashi | |
| 6,635,117 B1 | 10/2003 | Kinnard et al. | |
| 6,638,839 B2 | 10/2003 | Deng et al. | |
| 6,645,304 B2 | 11/2003 | Yamaguchi | |

(56) References Cited

U.S. PATENT DOCUMENTS

| | | |
|---|---|---|
| 6,648,974 B1 | 11/2003 | Ogliari et al. |
| 6,649,921 B1 | 11/2003 | Cekic et al. |
| 6,652,924 B2 | 11/2003 | Sherman |
| 6,656,281 B1 | 12/2003 | Ueda |
| 6,662,817 B2 | 12/2003 | Yamagishi |
| 6,673,196 B1 | 1/2004 | Oyabu |
| 6,682,973 B1 | 1/2004 | Paton et al. |
| D486,891 S | 2/2004 | Cronce |
| 6,688,784 B1 | 2/2004 | Templeton |
| 6,689,220 B1 | 2/2004 | Nguyen |
| 6,692,575 B1 | 2/2004 | Omstead et al. |
| 6,692,576 B2 | 2/2004 | Halpin et al. |
| 6,699,003 B2 | 3/2004 | Saeki |
| 6,709,989 B2 | 3/2004 | Ramdani et al. |
| 6,710,364 B2 | 3/2004 | Guldi et al. |
| 6,713,824 B1 | 3/2004 | Mikata |
| 6,716,571 B2 | 4/2004 | Gabriel |
| 6,720,260 B1 | 4/2004 | Fair et al. |
| 6,723,642 B1 | 4/2004 | Lim et al. |
| 6,730,614 B1 | 5/2004 | Lim et al. |
| 6,734,090 B2 | 5/2004 | Agarwala et al. |
| 6,740,853 B1 | 5/2004 | Kitayama et al. |
| 6,743,475 B2 | 6/2004 | Skarp et al. |
| 6,743,738 B2 | 6/2004 | Todd et al. |
| 6,753,507 B2 | 6/2004 | Fure et al. |
| 6,756,293 B2 | 6/2004 | Li et al. |
| 6,756,318 B2 | 6/2004 | Nguyen et al. |
| 6,759,098 B2 | 7/2004 | Han |
| 6,760,981 B2 | 7/2004 | Leap |
| 6,784,108 B1 | 8/2004 | Donohoe et al. |
| D497,977 S | 11/2004 | Engelbrektsson |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,825,134 B2 | 11/2004 | Law et al. |
| 6,831,004 B2 | 12/2004 | Byun |
| 6,835,039 B2 | 12/2004 | Van Den Berg |
| 6,846,515 B2 | 1/2005 | Vrtis |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,864,041 B2 | 3/2005 | Brown |
| 6,872,258 B2 | 3/2005 | Park et al. |
| 6,872,259 B2 | 3/2005 | Strang |
| 6,874,247 B1 | 4/2005 | Hsu |
| 6,874,480 B1 | 4/2005 | Ismailov |
| 6,875,677 B1 | 4/2005 | Conley, Jr. et al. |
| 6,876,017 B2 | 4/2005 | Goodner |
| 6,878,402 B2 | 4/2005 | Chiang et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,895,158 B2 | 5/2005 | Alyward et al. |
| 6,899,507 B2 | 5/2005 | Yamagishi et al. |
| 6,909,839 B2 | 6/2005 | Wang et al. |
| 6,911,092 B2 | 6/2005 | Sneh |
| 6,913,796 B2 | 7/2005 | Albano et al. |
| 6,930,041 B2 | 8/2005 | Agarwal |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,942,753 B2 | 9/2005 | Choi et al. |
| 6,951,587 B1 | 10/2005 | Narushima |
| 6,953,609 B2 | 10/2005 | Carollo |
| 6,955,836 B2 | 10/2005 | Kumagai et al. |
| 6,972,055 B2 | 12/2005 | Sferlazzo |
| 6,972,478 B1 | 12/2005 | Waite et al. |
| 6,974,781 B2 | 12/2005 | Timmermans et al. |
| 6,976,822 B2 | 12/2005 | Woodruff |
| 6,984,595 B1 | 1/2006 | Yamazaki |
| 6,990,430 B2 | 1/2006 | Hosek |
| 7,005,391 B2 | 2/2006 | Min |
| 7,018,941 B2 | 3/2006 | Cui et al. |
| 7,021,881 B2 | 4/2006 | Yamagishi |
| 7,041,609 B2 | 5/2006 | Vaartstra |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,060 B1 | 8/2006 | Furukawa |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,101,763 B1 | 9/2006 | Anderson et al. |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B2 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,186,648 B1 | 3/2007 | Rozbicki |
| 7,192,824 B2 | 3/2007 | Ahn et al. |
| 7,192,892 B2 | 3/2007 | Ahn et al. |
| 7,195,693 B2 | 3/2007 | Cowans |
| 7,201,943 B2 | 4/2007 | Park et al. |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,208,413 B2 | 4/2007 | Byun |
| 7,211,524 B2 | 5/2007 | Ryu et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,238,616 B2 | 7/2007 | Agarwal |
| 7,265,061 B1 | 9/2007 | Cho et al. |
| D553,104 S | 10/2007 | Oohashi et al. |
| 7,290,813 B2 | 11/2007 | Bonora |
| 7,294,581 B2 | 11/2007 | Haverkort et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,381,644 B1 | 6/2008 | Soubramonium et al. |
| 7,387,685 B2 | 6/2008 | Choi et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| D575,713 S | 8/2008 | Ratcliffe |
| 7,411,352 B2 | 8/2008 | Madocks |
| 7,414,281 B1 | 8/2008 | Fastow |
| 7,422,653 B2 | 9/2008 | Blahnik et al. |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |

(56) References Cited

U.S. PATENT DOCUMENTS

| | | | |
|---|---|---|---|
| 7,437,060 B2 | 10/2008 | Wang et al. | |
| 7,442,275 B2 | 10/2008 | Cowans | |
| 7,476,291 B2 | 1/2009 | Wang et al. | |
| 7,479,198 B2 | 1/2009 | Guffrey | |
| D585,968 S | 2/2009 | Elkins et al. | |
| 7,489,389 B2 | 2/2009 | Shibazaki et al. | |
| 7,494,882 B2 | 2/2009 | Vitale | |
| 7,498,242 B2 | 3/2009 | Kumar et al. | |
| 7,501,292 B2 | 3/2009 | Matsushita et al. | |
| 7,501,355 B2 | 3/2009 | Bhatia et al. | |
| 7,503,980 B2 | 3/2009 | Kida et al. | |
| D590,933 S | 4/2009 | Vansell | |
| 7,514,375 B1 | 4/2009 | Shanker et al. | |
| 7,541,297 B2 | 4/2009 | Mallick et al. | |
| D593,969 S | 6/2009 | Li | |
| 7,547,363 B2 | 6/2009 | Tomiyasu et al. | |
| 7,550,396 B2 | 6/2009 | Frohberg et al. | |
| 7,563,715 B2 | 7/2009 | Haukka et al. | |
| 7,566,891 B2 | 7/2009 | Rocha-Alvarez et al. | |
| 7,575,968 B2 | 8/2009 | Sadaka et al. | |
| 7,579,285 B2 | 8/2009 | Zimmerman et al. | |
| 7,579,785 B2 | 8/2009 | DeVincentis et al. | |
| 7,582,555 B1 | 9/2009 | Lang | |
| 7,589,003 B2 | 9/2009 | Kouvetakis et al. | |
| 7,589,029 B2 | 9/2009 | Derderian et al. | |
| D602,575 S | 10/2009 | Breda | |
| 7,598,513 B2 | 10/2009 | Kouvetakis et al. | |
| 7,601,223 B2 | 10/2009 | Lindfors et al. | |
| 7,601,225 B2 | 10/2009 | Tuominen et al. | |
| 7,601,652 B2 | 10/2009 | Singh et al. | |
| 7,611,751 B2 | 11/2009 | Elers | |
| 7,611,980 B2 | 11/2009 | Wells et al. | |
| 7,618,226 B2 | 11/2009 | Takizawa | |
| 7,622,378 B2 | 11/2009 | Liu et al. | |
| D606,952 S | 12/2009 | Lee | |
| 7,629,277 B2 | 12/2009 | Ghatnagar | |
| 7,632,549 B2 | 12/2009 | Goundar | |
| 7,640,142 B2 | 12/2009 | Tachikawa et al. | |
| 7,648,927 B2 | 1/2010 | Singh et al. | |
| 7,651,583 B2 | 1/2010 | Kent et al. | |
| 7,651,955 B2 | 1/2010 | Ranish et al. | |
| 7,651,961 B2 | 1/2010 | Clark | |
| D609,652 S | 2/2010 | Nagasaka | |
| D609,655 S | 2/2010 | Sugimoto | |
| 7,678,197 B2 | 3/2010 | Maki | |
| 7,678,715 B2 | 3/2010 | Mungekar et al. | |
| 7,682,454 B2 | 3/2010 | Sneh | |
| 7,682,657 B2 | 3/2010 | Sherman | |
| D613,829 S | 4/2010 | Griffin et al. | |
| D614,153 S | 4/2010 | Fondurulia et al. | |
| D614,267 S | 4/2010 | Breda | |
| D614,268 S | 4/2010 | Breda | |
| D614,593 S | 4/2010 | Lee | |
| 7,690,881 B2 | 4/2010 | Yamagishi | |
| 7,691,205 B2 | 4/2010 | Ikedo | |
| 7,695,808 B2 | 4/2010 | Tuma | |
| 7,713,874 B2 | 5/2010 | Milligan | |
| 7,720,560 B2 | 5/2010 | Menser et al. | |
| 7,723,648 B2 | 5/2010 | Tsukamoto et al. | |
| 7,727,864 B2 | 6/2010 | Elers | |
| 7,732,343 B2 | 6/2010 | Niroomand et al. | |
| 7,740,705 B2 | 6/2010 | Li | |
| 7,745,346 B2 | 6/2010 | Hausmann et al. | |
| 7,748,760 B2 | 7/2010 | Kushida | |
| 7,754,621 B2 | 7/2010 | Putjkonen | |
| 7,763,869 B2 | 7/2010 | Matsushita et al. | |
| 7,767,262 B2 | 8/2010 | Clark | |
| 7,771,796 B2 | 8/2010 | Kohno et al. | |
| 7,780,440 B2 | 8/2010 | Shibagaki et al. | |
| 7,789,965 B2 | 9/2010 | Matsushita et al. | |
| 7,790,633 B1 | 9/2010 | Tarafdar et al. | |
| 7,798,096 B2 * | 9/2010 | Mahajani | C23C 16/45508 118/723 E |
| 7,803,722 B2 | 9/2010 | Liang | |
| 7,807,578 B2 | 10/2010 | Bencher et al. | |
| 7,816,278 B2 | 10/2010 | Reed et al. | |
| 7,824,492 B2 | 11/2010 | Tois et al. | |
| 7,825,040 B1 | 11/2010 | Fukazawa et al. | |
| 7,833,353 B2 | 11/2010 | Furukawahara et al. | |
| 7,838,084 B2 | 11/2010 | Derderian et al. | |
| 7,842,518 B2 | 11/2010 | Miyajima | |
| 7,842,622 B1 | 11/2010 | Lee et al. | |
| D629,874 S | 12/2010 | Hermans | |
| 7,851,019 B2 | 12/2010 | Tuominen et al. | |
| 7,851,232 B2 | 12/2010 | van Schravendijk et al. | |
| 7,858,533 B2 | 12/2010 | Liu et al. | |
| 7,865,070 B2 | 1/2011 | Nakamura | |
| 7,884,918 B2 | 2/2011 | Hattori | |
| 7,888,233 B1 | 2/2011 | Gauri | |
| D634,719 S | 3/2011 | Yasuda et al. | |
| 7,897,215 B1 | 3/2011 | Fair et al. | |
| 7,902,582 B2 | 3/2011 | Forbes et al. | |
| 7,906,174 B1 | 3/2011 | Wu et al. | |
| 7,910,288 B2 | 3/2011 | Abatchev et al. | |
| 7,915,139 B1 | 3/2011 | Lang | |
| 7,919,416 B2 | 4/2011 | Lee et al. | |
| 7,925,378 B2 | 4/2011 | Gilchrist et al. | |
| 7,935,940 B1 | 5/2011 | Smargiassi | |
| 7,939,447 B2 | 5/2011 | Bauer et al. | |
| 7,955,516 B2 | 6/2011 | Chandrachood | |
| 7,963,736 B2 | 6/2011 | Takizawa et al. | |
| 7,972,980 B2 | 7/2011 | Lee et al. | |
| 7,977,256 B2 | 7/2011 | Liu et al. | |
| 7,981,751 B2 | 7/2011 | Zhu et al. | |
| D643,055 S | 8/2011 | Takahashi | |
| 7,992,318 B2 | 8/2011 | Kawaji | |
| 7,994,721 B2 | 8/2011 | Espiau et al. | |
| 7,998,875 B2 | 8/2011 | DeYoung | |
| 8,003,174 B2 | 8/2011 | Fukazawa | |
| 8,004,198 B2 | 8/2011 | Bakre et al. | |
| 8,020,315 B2 | 9/2011 | Nishimura | |
| 8,030,129 B2 | 10/2011 | Jeong | |
| 8,038,835 B2 | 10/2011 | Hayashi et al. | |
| 8,041,197 B2 | 10/2011 | Kasai et al. | |
| 8,041,450 B2 | 10/2011 | Takizawa et al. | |
| 8,043,972 B1 | 10/2011 | Liu et al. | |
| 8,048,783 B2 | 11/2011 | Chung et al. | |
| 8,055,378 B2 | 11/2011 | Numakura | |
| 8,060,252 B2 | 11/2011 | Gage et al. | |
| 8,083,853 B2 | 11/2011 | Choi et al. | |
| 8,071,451 B2 | 12/2011 | Uzoh | |
| 8,071,452 B2 | 12/2011 | Raisanen | |
| 8,072,578 B2 | 12/2011 | Yasuda et al. | |
| 8,076,230 B2 | 12/2011 | Wei | |
| 8,076,237 B2 | 12/2011 | Uzoh | |
| 8,082,946 B2 | 12/2011 | Laverdiere et al. | |
| 8,084,372 B2 | 12/2011 | You et al. | |
| D652,896 S | 1/2012 | Gether | |
| 8,092,604 B2 | 1/2012 | Tomiyasu et al. | |
| D653,734 S | 2/2012 | Sisk | |
| D654,884 S | 2/2012 | Honma | |
| D655,055 S | 2/2012 | Toll | |
| 8,114,734 B2 | 2/2012 | Yang | |
| 8,119,466 B2 | 2/2012 | Avouris | |
| 8,129,290 B2 | 3/2012 | Balseanu et al. | |
| 8,137,462 B2 | 3/2012 | Fondurulia et al. | |
| 8,137,465 B1 | 3/2012 | Shrinivasan et al. | |
| 8,138,104 B2 | 3/2012 | Balseanu et al. | |
| 8,138,676 B2 | 3/2012 | Mills | |
| 8,142,862 B2 | 3/2012 | Lee et al. | |
| 8,143,174 B2 | 3/2012 | Xia et al. | |
| 8,147,242 B2 | 4/2012 | Shibagaki et al. | |
| 8,173,554 B2 | 5/2012 | Lee et al. | |
| 8,187,679 B2 | 5/2012 | Dickey et al. | |
| 8,187,951 B1 | 5/2012 | Wang | |
| 8,272,516 B2 | 5/2012 | Salvador | |
| 8,192,901 B2 | 6/2012 | Kageyama | |
| 8,196,234 B2 | 6/2012 | Glunk | |
| 8,197,915 B2 | 6/2012 | Oka et al. | |
| 8,216,380 B2 | 7/2012 | White et al. | |
| 8,231,799 B2 | 7/2012 | Bera et al. | |
| D665,055 S | 8/2012 | Yanagisawa et al. | |
| 8,241,991 B2 | 8/2012 | Hsieh et al. | |
| 8,242,028 B1 | 8/2012 | van Schravendijk | |

(56) References Cited

U.S. PATENT DOCUMENTS

| | | |
|---|---|---|
| 8,242,031 B2 | 8/2012 | Mallick et al. |
| 8,246,900 B2 | 8/2012 | Kasai et al. |
| 8,252,114 B2 | 8/2012 | Vukovic |
| 8,252,659 B2 | 8/2012 | Huyghabaert et al. |
| 8,252,691 B2 | 8/2012 | Beynet et al. |
| 8,267,633 B2 | 9/2012 | Obikane |
| 8,278,176 B2 | 10/2012 | Bauer et al. |
| 8,282,769 B2 | 10/2012 | Iizuka |
| 8,282,847 B2 | 10/2012 | Romano |
| 8,287,648 B2 | 10/2012 | Reed et al. |
| 8,293,016 B2 | 10/2012 | Bahng et al. |
| 8,293,642 B2 | 10/2012 | Kim |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,328,939 B2 | 12/2012 | Choi et al. |
| 8,329,599 B2 | 12/2012 | Fukazawa et al. |
| 8,334,219 B2 | 12/2012 | Lee et al. |
| D676,943 S | 2/2013 | Kluss |
| 8,367,528 B2 | 2/2013 | Bauer et al. |
| 8,372,204 B2 | 2/2013 | Nakamura |
| 8,378,464 B2 | 2/2013 | Kato et al. |
| 8,393,091 B2 | 3/2013 | Kawamoto |
| 8,394,466 B2 | 3/2013 | Hong et al. |
| 8,404,499 B2 | 3/2013 | Moffatt |
| 8,415,259 B2 | 4/2013 | Lee et al. |
| 8,440,259 B2 | 5/2013 | Chiang et al. |
| 8,444,120 B2 | 5/2013 | Gregg et al. |
| 8,445,075 B2 | 5/2013 | Xu et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,492,170 B2 | 7/2013 | Xie et al. |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 11/2013 | Goto et al. |
| 8,617,411 B2 | 12/2013 | Singh |
| 8,633,115 B2 | 1/2014 | Chang et al. |
| 8,642,488 B2 | 2/2014 | Liu et al. |
| 8,647,722 B2 | 2/2014 | Kobayashi et al. |
| 8,664,627 B1 | 3/2014 | Ishikawa et al. |
| 8,667,654 B2 | 3/2014 | Gros-Jean |
| 8,668,957 B2 | 3/2014 | Dussarrat et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,721,791 B2 | 5/2014 | Choi et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,785,311 B2 | 7/2014 | Miyoshi |
| 8,790,749 B2 | 7/2014 | Omori et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,841,182 B1 | 9/2014 | Chen et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,927,906 B2 | 1/2015 | Tadokoro et al. |
| 8,933,375 B2 | 1/2015 | Dunn et al. |
| 8,940,646 B1 | 1/2015 | Chandrasekharan |
| D723,153 S | 2/2015 | Borkholder |
| 8,945,306 B2 | 2/2015 | Tsuda |
| 8,946,830 B2 | 2/2015 | Jung et al. |
| 8,956,971 B2 | 2/2015 | Huakka |
| 8,956,983 B2 | 2/2015 | Swaminathan |
| D724,553 S | 3/2015 | Choi |
| D724,701 S | 3/2015 | Yamagishi et al. |
| D725,168 S | 3/2015 | Yamagishi |
| 8,967,608 B2 | 3/2015 | Mitsumori et al. |
| 8,986,456 B2 | 3/2015 | Fondurulia et al. |
| 8,991,214 B2 | 3/2015 | Hoshino et al. |
| 8,991,887 B2 | 3/2015 | Shin et al. |
| 8,993,054 B2 | 3/2015 | Jung et al. |
| D726,365 S | 4/2015 | Weigensberg |
| D726,884 S | 4/2015 | Yamagishi et al. |
| 8,999,102 B2 | 4/2015 | Miyoshi et al. |
| 9,005,539 B2 | 4/2015 | Halpin et al. |
| 9,017,481 B1 | 4/2015 | Pettinger et al. |
| 9,017,933 B2 | 4/2015 | Liu et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B1 | 5/2015 | Nakano |
| D732,145 S | 6/2015 | Yamagishi |
| D732,644 S | 6/2015 | Yamagishi et al. |
| D733,261 S | 6/2015 | Yamagishi et al. |
| D733,262 S | 7/2015 | Yamagishi et al. |
| D734,377 S | 7/2015 | Hirakida |
| D735,836 S | 8/2015 | Yamagishi |
| 9,096,931 B2 | 8/2015 | Yednak et al. |
| 9,117,657 B2 | 8/2015 | Nakano et al. |
| 9,117,866 B2 | 8/2015 | Marquardt et al. |
| D739,222 S | 9/2015 | Chadbourne |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,169,975 B2 | 10/2015 | Sarin et al. |
| 9,171,714 B2 | 10/2015 | Mori |
| 9,171,716 B2 | 10/2015 | Fukuda |
| D743,513 S | 11/2015 | Yamagishi |
| 9,177,784 B2 | 11/2015 | Raisanen et al. |
| 9,184,047 B2 | 11/2015 | Liu et al. |
| 9,190,263 B2 | 11/2015 | Ishikawa et al. |
| 9,196,483 B1 | 11/2015 | Lee et al. |
| 9,202,727 B2 | 12/2015 | Dunn et al. |
| 9,228,259 B2 | 1/2016 | Haukka et al. |
| 9,240,412 B2 | 1/2016 | Xie et al. |
| 9,252,024 B2 | 2/2016 | Lam et al. |
| 9,299,595 B2 | 3/2016 | Dunn et al. |
| 9,324,811 B2 | 4/2016 | Weeks |
| 9,324,846 B1 | 4/2016 | Camillo |
| 9,341,296 B2 | 5/2016 | Yednak |
| 9,384,987 B2 | 7/2016 | Jung et al. |
| 9,394,608 B2 | 7/2016 | Shero et al. |
| 9,396,934 B2 | 7/2016 | Tolle |
| 9,396,956 B1 | 7/2016 | Fukazawa |
| 9,404,587 B2 | 8/2016 | Shugrue |
| 9,412,564 B2 | 8/2016 | Milligan |
| 9,443,725 B2 | 9/2016 | Liu et al. |
| 9,447,498 B2 | 9/2016 | Shiba et al. |
| 9,455,138 B1 | 9/2016 | Fukazawa |
| 9,543,180 B2 | 1/2017 | Kamiya |
| 9,556,516 B2 | 1/2017 | Takamure |
| 9,558,931 B2 | 1/2017 | Tang |
| 9,589,770 B2 | 3/2017 | Winkler |
| 9,605,342 B2 | 3/2017 | Alokozai et al. |
| 9,605,343 B2 | 3/2017 | Winkler |

(56) References Cited

U.S. PATENT DOCUMENTS

| | | |
|---|---|---|
| 9,613,801 B2 | 4/2017 | Carcasi et al. |
| 9,640,416 B2 | 5/2017 | Arai |
| 9,647,114 B2 | 5/2017 | Margetis |
| 9,659,799 B2 | 5/2017 | Lawson |
| 9,741,559 B2 | 8/2017 | Shimura et al. |
| 9,909,214 B2 | 3/2018 | Suemori |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0020715 A1 | 9/2001 | Yamasaki |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0001976 A1 | 1/2002 | Danek |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0076507 A1 | 6/2002 | Chiang et al. |
| 2002/0079714 A1 | 6/2002 | Soucy et al. |
| 2002/0081826 A1 | 6/2002 | Rotondaro et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |
| 2002/0110991 A1 | 8/2002 | Li |
| 2002/0114886 A1 | 8/2002 | Chou et al. |
| 2002/0115252 A1 | 8/2002 | Haukka et al. |
| 2002/0139775 A1 | 10/2002 | Chang |
| 2002/0164420 A1 | 11/2002 | Derderian et al. |
| 2002/0172768 A1 | 11/2002 | Endo et al. |
| 2002/0187650 A1 | 12/2002 | Blalock et al. |
| 2002/0197849 A1 | 12/2002 | Mandal |
| 2003/0003635 A1 | 1/2003 | Paranjpe et al. |
| 2003/0003696 A1 | 1/2003 | Gelatos et al. |
| 2003/0010452 A1 | 1/2003 | Park et al. |
| 2003/0012632 A1 | 1/2003 | Saeki |
| 2003/0015596 A1 | 1/2003 | Evans |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0049375 A1 | 3/2003 | Nguyen et al. |
| 2003/0049937 A1 | 3/2003 | Suzuki |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0082307 A1 | 5/2003 | Chung et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0116087 A1 | 6/2003 | Nguyen |
| 2003/0121608 A1 | 7/2003 | Chen |
| 2003/0134038 A1 | 7/2003 | Paranjpe |
| 2003/0141820 A1 | 7/2003 | White et al. |
| 2003/0143328 A1 | 7/2003 | Chen |
| 2003/0157436 A1 | 8/2003 | Manger et al. |
| 2003/0159656 A1 | 8/2003 | Tan |
| 2003/0168001 A1 | 9/2003 | Sneh |
| 2003/0168750 A1 | 9/2003 | Basceri et al. |
| 2003/0170583 A1 | 9/2003 | Nakashima |
| 2003/0173490 A1 | 9/2003 | Lappen |
| 2003/0180458 A1 | 9/2003 | Sneh |
| 2003/0183156 A1 | 10/2003 | Dando |
| 2003/0188685 A1 | 10/2003 | Wang |
| 2003/0192875 A1 | 10/2003 | Bicker et al. |
| 2003/0198587 A1 | 10/2003 | Kaloyeros |
| 2003/0209323 A1 | 11/2003 | Yokogaki |
| 2003/0211735 A1 | 11/2003 | Rossman |
| 2003/0217915 A1 | 11/2003 | Ouellet |
| 2003/0228772 A1 | 12/2003 | Cowans |
| 2003/0232138 A1 | 12/2003 | Tuominen et al. |
| 2004/0009307 A1 | 1/2004 | Koh et al. |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0016637 A1 | 1/2004 | Yang |
| 2004/0018307 A1 | 1/2004 | Park et al. |
| 2004/0018723 A1 | 1/2004 | Byun |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0048439 A1 | 3/2004 | Soman |
| 2004/0050325 A1 | 3/2004 | Samoilov |
| 2004/0062081 A1 | 4/2004 | Drewes |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0094402 A1 | 5/2004 | Gopalraja |
| 2004/0101622 A1 | 5/2004 | Park et al. |
| 2004/0103914 A1 | 6/2004 | Cheng et al. |
| 2004/0106249 A1 | 6/2004 | Huotari |
| 2004/0124131 A1 | 7/2004 | Aitchison |
| 2004/0124549 A1 | 7/2004 | Curran |
| 2004/0126990 A1 | 7/2004 | Ohta |
| 2004/0129211 A1 | 7/2004 | Blonigan et al. |
| 2004/0134429 A1 | 7/2004 | Yamanaka |
| 2004/0144980 A1 | 7/2004 | Ahn et al. |
| 2004/0146644 A1 | 7/2004 | Xia et al. |
| 2004/0151845 A1 | 8/2004 | Nguyen et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0206305 A1 | 10/2004 | Choi et al. |
| 2004/0209477 A1 | 10/2004 | Buxbaum et al. |
| 2004/0211357 A1 | 10/2004 | Gadgil |
| 2004/0212947 A1 | 10/2004 | Nguyen |
| 2004/0213921 A1 | 10/2004 | Leu |
| 2004/0214399 A1 | 10/2004 | Ahn et al. |
| 2004/0214445 A1 | 10/2004 | Shimizu et al. |
| 2004/0219793 A1 | 11/2004 | Hishiya et al. |
| 2004/0221807 A1 | 11/2004 | Verghese et al. |
| 2004/0247779 A1 | 12/2004 | Selvamanickam |
| 2004/0261712 A1 | 12/2004 | Hayashi et al. |
| 2004/0266011 A1 | 12/2004 | Lee et al. |
| 2005/0003662 A1 | 1/2005 | Jurisch et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0037610 A1 | 2/2005 | Cha |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092247 A1 | 5/2005 | Schmidt |
| 2005/0092249 A1 | 5/2005 | Kilpela et al. |
| 2005/0095770 A1 | 5/2005 | Kumagai et al. |
| 2005/0100669 A1 | 5/2005 | Kools et al. |
| 2005/0101154 A1 | 5/2005 | Huang |
| 2005/0106893 A1 | 5/2005 | Wilk |
| 2005/0110069 A1 | 5/2005 | Kil et al. |
| 2005/0118804 A1 | 6/2005 | Byun |
| 2005/0120805 A1 | 6/2005 | Lane |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |

(56) References Cited

U.S. PATENT DOCUMENTS

| | | |
|---|---|---|
| 2005/0142361 A1 | 6/2005 | Nakanishi |
| 2005/0145338 A1 | 7/2005 | Park et al. |
| 2005/0153571 A1 | 7/2005 | Senzaki |
| 2005/0172895 A1 | 8/2005 | Kijima et al. |
| 2005/0173003 A1 | 8/2005 | Laverdiere et al. |
| 2005/0175789 A1 | 8/2005 | Helms |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0199013 A1 | 9/2005 | Vandroux et al. |
| 2005/0208718 A1 | 9/2005 | Lim et al. |
| 2005/0211167 A1 | 9/2005 | Gunji |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223982 A1 | 10/2005 | Park et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0241763 A1 | 11/2005 | Huang et al. |
| 2005/0249876 A1 | 11/2005 | Kawahara et al. |
| 2005/0251990 A1 | 11/2005 | Choi |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0277271 A1 | 12/2005 | Beintner |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021572 A1 | 2/2006 | Wolden |
| 2006/0021703 A1 | 2/2006 | Umotoy et al. |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0057828 A1 | 3/2006 | Omura |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0087638 A1 | 4/2006 | Hirayanagi |
| 2006/0105566 A1 | 5/2006 | Waldfried et al. |
| 2006/0107898 A1 | 5/2006 | Blomberg |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0177855 A1 | 8/2006 | Utermohlen |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228496 A1 | 10/2006 | Choi |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0252228 A1 | 11/2006 | Jeng |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1* | 11/2006 | Ramaswamy .......... C23C 16/26 118/719 |
| 2006/0263522 A1 | 11/2006 | Byun |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269692 A1 | 11/2006 | Balseanu |
| 2006/0278524 A1 | 12/2006 | Stowell |
| 2006/0283629 A1 | 12/2006 | Kikuchi et al. |
| 2006/0286774 A1 | 12/2006 | Singh et al. |
| 2006/0286818 A1 | 12/2006 | Wang et al. |
| 2006/0286819 A1 | 12/2006 | Seutter |
| 2006/0291982 A1 | 12/2006 | Tanaka |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0066079 A1 | 3/2007 | Kolster et al. |
| 2007/0077355 A1 | 4/2007 | Chacin et al. |
| 2007/0082132 A1 | 4/2007 | Shinriki |
| 2007/0082500 A1 | 4/2007 | Norman et al. |
| 2007/0084405 A1 | 4/2007 | Kim |
| 2007/0087579 A1 | 4/2007 | Kitayama et al. |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0128876 A1 | 6/2007 | Fukiage |
| 2007/0128888 A1 | 6/2007 | Goto et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaarstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |

(56) References Cited

U.S. PATENT DOCUMENTS

| | | |
|---|---|---|
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0237699 A1 | 10/2007 | Clark |
| 2007/0241688 A1 | 10/2007 | DeVancentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0252244 A1 | 11/2007 | Srividya et al. |
| 2007/0252532 A1 | 11/2007 | DeVancentis et al. |
| 2007/0264807 A1 | 11/2007 | Leone et al. |
| 2007/0269983 A1 | 11/2007 | Sneh |
| 2007/0275166 A1 | 11/2007 | Thridandam et al. |
| 2007/0277735 A1 | 12/2007 | Mokhesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0018004 A1 | 1/2008 | Steidl |
| 2008/0020591 A1 | 1/2008 | Balseanu et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Lukas |
| 2008/0050538 A1 | 2/2008 | Hirata |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0102203 A1 | 5/2008 | Wu |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0124946 A1 | 5/2008 | Xiao et al. |
| 2008/0133154 A1 | 6/2008 | Krauss et al. |
| 2008/0142483 A1 | 6/2008 | Hua |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0157365 A1 | 7/2008 | Ott et al. |
| 2008/0173237 A1 | 7/2008 | Collins |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0178805 A1 | 7/2008 | Paterson et al. |
| 2008/0179104 A1 | 7/2008 | Zhang |
| 2008/0179715 A1 | 7/2008 | Coppa |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0202416 A1 | 8/2008 | Provencher |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0220619 A1 | 9/2008 | Matsushita et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0257494 A1 | 10/2008 | Hayashi et al. |
| 2008/0260963 A1 | 10/2008 | Yoon et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0277715 A1 | 11/2008 | Ohmi et al. |
| 2008/0282970 A1 | 11/2008 | Heys et al. |
| 2008/0283962 A1 | 11/2008 | Dyer |
| 2008/0295872 A1 | 12/2008 | Riker et al. |
| 2008/0298945 A1 | 12/2008 | Cox |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029503 A1 | 1/2009 | Arai |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0042344 A1 | 2/2009 | Ye et al. |
| 2009/0045829 A1 | 2/2009 | Awazu |
| 2009/0050621 A1 | 2/2009 | Awazu |
| 2009/0053023 A1 | 2/2009 | Wakabayashi |
| 2009/0061644 A1 | 3/2009 | Chiang et al. |
| 2009/0061647 A1 | 3/2009 | Mallick et al. |
| 2009/0075491 A1 | 3/2009 | Liu et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0104789 A1 | 4/2009 | Mallick et al. |
| 2009/0107404 A1 | 4/2009 | Ogliari et al. |
| 2009/0120580 A1 | 5/2009 | Kagoshima et al. |
| 2009/0122293 A1 | 5/2009 | Shibazaki |
| 2009/0130331 A1 | 5/2009 | Asai |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142905 A1 | 6/2009 | Yamazaki |
| 2009/0142935 A1 | 6/2009 | Fukazawa et al. |
| 2009/0146322 A1 | 6/2009 | Weling et al. |
| 2009/0156015 A1 | 6/2009 | Park et al. |
| 2009/0162996 A1 | 6/2009 | Ramaswarmy et al. |
| 2009/0163038 A1 | 6/2009 | Miyoshi |
| 2009/0165715 A1 | 7/2009 | Oh |
| 2009/0200494 A1 | 8/2009 | Hatem |
| 2009/0206056 A1 | 8/2009 | Xu |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0227094 A1 | 9/2009 | Bateman |
| 2009/0236014 A1 | 9/2009 | Wilson |
| 2009/0239386 A1 | 9/2009 | Suzuki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0246971 A1 | 10/2009 | Reid et al. |
| 2009/0250955 A1 | 10/2009 | Aoki |
| 2009/0255901 A1 | 10/2009 | Okita |
| 2009/0261331 A1 | 10/2009 | Yang et al. |
| 2009/0269506 A1 | 10/2009 | Okura et al. |
| 2009/0269941 A1 | 10/2009 | Raisanen |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |

(56) References Cited

U.S. PATENT DOCUMENTS

| | | |
|---|---|---|
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0006923 A1 | 1/2010 | Fujitsuka |
| 2010/0014479 A1 | 1/2010 | Kim |
| 2010/0015813 A1 | 1/2010 | McGinnis et al. |
| 2010/0018460 A1 | 1/2010 | Singh et al. |
| 2010/0024727 A1 | 2/2010 | Kim et al. |
| 2010/0024872 A1 | 2/2010 | Kishimoto |
| 2010/0025796 A1 | 2/2010 | Dabiran |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 | 3/2010 | Kellock |
| 2010/0058984 A1 | 3/2010 | Marubayashi |
| 2010/0065758 A1 | 3/2010 | Liu et al. |
| 2010/0068009 A1 | 3/2010 | Kimura |
| 2010/0075507 A1 | 3/2010 | Chang et al. |
| 2010/0089320 A1 | 4/2010 | Kim |
| 2010/0090149 A1 | 4/2010 | Thompson et al. |
| 2010/0092696 A1 | 4/2010 | Shinriki |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0143609 A1 | 6/2010 | Fukazawa et al. |
| 2010/0144162 A1 | 6/2010 | Lee et al. |
| 2010/0151206 A1 | 6/2010 | Wu et al. |
| 2010/0159638 A1 | 6/2010 | Jeong |
| 2010/0162752 A1 | 7/2010 | Tabata et al. |
| 2010/0163524 A1 | 7/2010 | Arai |
| 2010/0163937 A1 | 7/2010 | Clendenning |
| 2010/0168404 A1 | 7/2010 | Girolami |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0183825 A1 | 7/2010 | Becker et al. |
| 2010/0184302 A1 | 7/2010 | Lee et al. |
| 2010/0186669 A1 | 7/2010 | Shin et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0229795 A1 | 9/2010 | Tanabe |
| 2010/0230051 A1 | 9/2010 | Iizuka |
| 2010/0233886 A1 | 9/2010 | Yang et al. |
| 2010/0236691 A1 | 9/2010 | Yamazaki |
| 2010/0243166 A1 | 9/2010 | Hayashi et al. |
| 2010/0244688 A1 | 9/2010 | Braun et al. |
| 2010/0248465 A1 | 9/2010 | Yi et al. |
| 2010/0255198 A1 | 10/2010 | Cleary et al. |
| 2010/0255625 A1 | 10/2010 | De Vries |
| 2010/0255658 A1 | 10/2010 | Aggarwal |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0282645 A1 | 11/2010 | Wang |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0027999 A1 | 2/2011 | Sparks et al. |
| 2011/0034039 A1 | 2/2011 | Liang et al. |
| 2011/0045610 A1 | 2/2011 | van Schravendijk |
| 2011/0048642 A1 | 3/2011 | Mihara et al. |
| 2011/0049100 A1 | 3/2011 | Han et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0117749 A1 | 5/2011 | Sheu |
| 2011/0124196 A1 | 5/2011 | Lee |
| 2011/0139748 A1 | 6/2011 | Donnelly et al. |
| 2011/0143032 A1 | 6/2011 | Vrtis et al. |
| 2011/0143461 A1 | 6/2011 | Fish et al. |
| 2011/0159202 A1 | 6/2011 | Matsushita |
| 2011/0159673 A1 | 6/2011 | Hanawa et al. |
| 2011/0159680 A1 | 6/2011 | Yoo |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0183527 A1 | 7/2011 | Cho |
| 2011/0192820 A1 | 8/2011 | Yeom et al. |
| 2011/0198736 A1 | 8/2011 | Shero et al. |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0237040 A1 | 9/2011 | Ng et al. |
| 2011/0239936 A1 | 10/2011 | Suzaki et al. |
| 2011/0254052 A1 | 10/2011 | Kouvetakis |
| 2011/0256675 A1 | 10/2011 | Avouris |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0263107 A1 | 10/2011 | Chung et al. |
| 2011/0265549 A1 | 11/2011 | Cruse et al. |
| 2011/0265715 A1 | 11/2011 | Keller |
| 2011/0265725 A1 | 11/2011 | Tsuji |
| 2011/0265951 A1 | 11/2011 | Xu et al. |
| 2011/0275018 A1 | 11/2011 | Matteo et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0294288 A1 | 12/2011 | Lee et al. |
| 2011/0308460 A1 | 12/2011 | Hong et al. |
| 2011/0312191 A1 | 12/2011 | Ohkura et al. |
| 2012/0003500 A1 | 1/2012 | Yoshida et al. |
| 2012/0006489 A1 | 1/2012 | Okita |
| 2012/0009802 A1 | 1/2012 | Lavoie |
| 2012/0024479 A1 | 2/2012 | Palagashvili et al. |
| 2012/0032311 A1 | 2/2012 | Gates |
| 2012/0036732 A1 | 2/2012 | Varadarajan |
| 2012/0043556 A1 | 2/2012 | Dube et al. |
| 2012/0052681 A1 | 3/2012 | Marsh |
| 2012/0058630 A1 | 3/2012 | Quinn |
| 2012/0070136 A1 | 3/2012 | Koelmel et al. |
| 2012/0070997 A1 | 3/2012 | Larson |
| 2012/0080756 A1 | 4/2012 | Suzuki |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |

(56) References Cited

U.S. PATENT DOCUMENTS

| | | |
|---|---|---|
| 2012/0108039 A1 | 5/2012 | Zajaji |
| 2012/0114877 A1 | 5/2012 | Lee |
| 2012/0121823 A1 | 5/2012 | Chhabra |
| 2012/0122275 A1 | 5/2012 | Koo et al. |
| 2012/0122302 A1 | 5/2012 | Weisman et al. |
| 2012/0128897 A1 | 5/2012 | Xiao et al. |
| 2012/0135145 A1 | 5/2012 | Je et al. |
| 2012/0149213 A1 | 6/2012 | Nittala |
| 2012/0156108 A1 | 6/2012 | Fondurulia et al. |
| 2012/0156890 A1 | 6/2012 | Yim et al. |
| 2012/0160172 A1 | 6/2012 | Wamura et al. |
| 2012/0161405 A1 | 6/2012 | Mohn |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0187083 A1 | 7/2012 | Hashizume |
| 2012/0196450 A1 | 8/2012 | Balseanu et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0219824 A1 | 8/2012 | Prolier |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0263876 A1 | 10/2012 | Haukka et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabai et al. |
| 2013/0019945 A1 | 1/2013 | Hekmatshoar-Tabai et al. |
| 2013/0023129 A1 | 1/2013 | Reed |
| 2013/0048606 A1 | 2/2013 | Mao et al. |
| 2013/0061755 A1 | 3/2013 | Frederick |
| 2013/0064973 A1 | 3/2013 | Chen et al. |
| 2013/0068727 A1 | 3/2013 | Okita |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0084156 A1 | 4/2013 | Shimamoto |
| 2013/0084714 A1 | 4/2013 | Oka et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0115763 A1 | 5/2013 | Takamure et al. |
| 2013/0115768 A1 | 5/2013 | Pore et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0157409 A1 | 6/2013 | Vaidya |
| 2013/0160709 A1 | 6/2013 | White |
| 2013/0168354 A1 | 7/2013 | Kanarik |
| 2013/0175596 A1 | 7/2013 | Cheng et al. |
| 2013/0180448 A1 | 7/2013 | Sakaue et al. |
| 2013/0183814 A1 | 7/2013 | Huang et al. |
| 2013/0203266 A1 | 8/2013 | Hintze |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0269612 A1 | 10/2013 | Cheng et al. |
| 2013/0285155 A1 | 10/2013 | Glass |
| 2013/0288480 A1 | 10/2013 | Sanchez et al. |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0313656 A1 | 11/2013 | Tong |
| 2013/0319290 A1 | 12/2013 | Xiao et al. |
| 2013/0320429 A1 | 12/2013 | Thomas |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2013/0330933 A1 | 12/2013 | Fukazawa et al. |
| 2013/0337583 A1 | 12/2013 | Kobayashi et al. |
| 2013/0337653 A1 | 12/2013 | Kovalgin et al. |
| 2013/0340619 A1 | 12/2013 | Tammera |
| 2013/0344248 A1 | 12/2013 | Clark |
| 2014/0000843 A1 | 1/2014 | Dunn et al. |
| 2014/0001520 A1 | 1/2014 | Glass |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0033978 A1 | 2/2014 | Adachi et al. |
| 2014/0036274 A1 | 2/2014 | Marquardt et al. |
| 2014/0048765 A1 | 2/2014 | Ma et al. |
| 2014/0056679 A1 | 2/2014 | Yamabe et al. |
| 2014/0057454 A1 | 2/2014 | Subramonium |
| 2014/0060147 A1 | 3/2014 | Sarin et al. |
| 2014/0062304 A1 | 3/2014 | Nakano et al. |
| 2014/0065841 A1 | 3/2014 | Matero |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0096716 A1 | 4/2014 | Chung et al. |
| 2014/0099798 A1 | 4/2014 | Tsuji |
| 2014/0103145 A1 | 4/2014 | White et al. |
| 2014/0110798 A1 | 4/2014 | Cai |
| 2014/0113457 A1 | 4/2014 | Sims |
| 2014/0116335 A1 | 5/2014 | Tsuji et al. |
| 2014/0120487 A1 | 5/2014 | Kaneko |
| 2014/0120723 A1 | 5/2014 | Fu et al. |
| 2014/0120738 A1 | 5/2014 | Jung |
| 2014/0127907 A1 | 5/2014 | Yang |
| 2014/0141625 A1 | 5/2014 | Fuzazawa et al. |
| 2014/0158786 A1 | 6/2014 | Santo |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0193983 A1 | 7/2014 | Lavoie |
| 2014/0202386 A1 | 7/2014 | Taga |
| 2014/0202388 A1 | 7/2014 | Um et al. |
| 2014/0209976 A1 | 7/2014 | Yang et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0227881 A1 | 8/2014 | Lubomirsky et al. |
| 2014/0251953 A1 | 9/2014 | Winkler et al. |
| 2014/0251954 A1 | 9/2014 | Winkler et al. |
| 2014/0252134 A1 | 9/2014 | Chen |
| 2014/0273428 A1 | 9/2014 | Shero et al. |
| 2014/0273477 A1 | 9/2014 | Niskanen |
| 2014/0273528 A1 | 9/2014 | Niskanen |
| 2014/0273530 A1 | 9/2014 | Nguyen |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0363983 A1 | 12/2014 | Nakano et al. |

(56) References Cited

U.S. PATENT DOCUMENTS

| | | |
|---|---|---|
| 2014/0363985 A1 | 12/2014 | Jang et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0017794 A1 | 1/2015 | Takamure |
| 2015/0021599 A1 | 1/2015 | Ridgeway |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0079311 A1 | 3/2015 | Nakano |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0099342 A1 | 4/2015 | Tsai |
| 2015/0111374 A1 | 4/2015 | Bao |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0162168 A1 | 6/2015 | Oehrlien |
| 2015/0162214 A1 | 6/2015 | Thompson |
| 2015/0167159 A1 | 6/2015 | Halpin et al. |
| 2015/0170954 A1 | 6/2015 | Agarwal |
| 2015/0174768 A1 | 6/2015 | Rodnick |
| 2015/0184291 A1 | 7/2015 | Alokozai et al. |
| 2015/0187559 A1 | 7/2015 | Sano |
| 2015/0187568 A1 | 7/2015 | Pettinger et al. |
| 2015/0217330 A1 | 8/2015 | Haukka |
| 2015/0217456 A1 | 8/2015 | Tsuji et al. |
| 2015/0240359 A1 | 8/2015 | Jdira et al. |
| 2015/0243545 A1 | 8/2015 | Tang |
| 2015/0243658 A1 | 8/2015 | Joshi et al. |
| 2015/0259790 A1 | 9/2015 | Newman |
| 2015/0267295 A1 | 9/2015 | Hill et al. |
| 2015/0267297 A1 | 9/2015 | Shiba |
| 2015/0267299 A1 | 9/2015 | Hawkins |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0299848 A1 | 10/2015 | Haukka |
| 2015/0308586 A1 | 10/2015 | Shugrue et al. |
| 2015/0315704 A1 | 11/2015 | Nakano et al. |
| 2015/0343741 A1 | 12/2015 | Shibata et al. |
| 2015/0376211 A1 | 12/2015 | Girard |
| 2016/0013024 A1 | 1/2016 | Milligan et al. |
| 2016/0020092 A1 | 1/2016 | Kang |
| 2016/0024656 A1 | 1/2016 | White et al. |
| 2016/0035566 A1 | 2/2016 | LaVoie |
| 2016/0051964 A1 | 2/2016 | Tolle et al. |
| 2016/0099150 A1 | 4/2016 | Tsai |
| 2016/0133307 A1 | 5/2016 | Lee et al. |
| 2016/0133628 A1 | 5/2016 | Xie |
| 2016/0141172 A1 | 5/2016 | Kang |
| 2016/0148821 A1 | 5/2016 | Singh |
| 2016/0181128 A1 | 6/2016 | Mori |
| 2016/0190137 A1 | 6/2016 | Tsai et al. |
| 2016/0211147 A1 | 7/2016 | Fukazawa |
| 2016/0268107 A1 | 9/2016 | White |
| 2016/0276148 A1 | 9/2016 | Qian et al. |
| 2016/0289828 A1 | 10/2016 | Shero et al. |
| 2016/0358772 A1 | 12/2016 | Xie |
| 2016/0376700 A1 | 12/2016 | Haukka |
| 2016/0379851 A1* | 12/2016 | Swaminathan ... H01L 21/67115 438/715 |
| 2016/0381732 A1* | 12/2016 | Moench ............ H01L 21/67115 118/641 |
| 2017/0018477 A1 | 1/2017 | Kato |
| 2017/0037513 A1 | 2/2017 | Haukka |
| 2017/0092531 A1 | 3/2017 | Coomer |
| 2017/0100742 A1 | 4/2017 | Pore et al. |
| 2017/0103907 A1* | 4/2017 | Chu ..................... H01L 21/268 |
| 2017/0107621 A1 | 4/2017 | Suemori |
| 2017/0117202 A1 | 4/2017 | Tang et al. |
| 2017/0117203 A1 | 4/2017 | Tang et al. |
| 2017/0130332 A1 | 5/2017 | Stumpf |
| 2017/0136578 A1* | 5/2017 | Yoshimura .......... B23K 26/342 |
| 2017/0173696 A1* | 6/2017 | Sheinman ................ B22F 3/18 |
| 2017/0306478 A1 | 10/2017 | Raisanen |
| 2017/0306480 A1 | 10/2017 | Zhu et al. |
| 2018/0025890 A1 | 1/2018 | Choi |

FOREIGN PATENT DOCUMENTS

| | | |
|---|---|---|
| CN | 101522943 | 9/2009 |
| CN | 101423937 | 9/2011 |
| CN | 102383106 | 3/2012 |
| DE | 102008052750 | 6/2009 |
| EP | 2036600 | 3/2009 |
| EP | 2426233 | 7/2012 |
| JP | 03-044472 | 2/1991 |
| JP | H04115531 | 4/1992 |
| JP | 07-034936 | 8/1995 |
| JP | 7-272694 | 10/1995 |
| JP | H07283149 | 10/1995 |
| JP | 08-181135 | 7/1996 |
| JP | H08335558 | 12/1996 |
| JP | 10-064696 | 3/1998 |
| JP | 10-0261620 | 9/1998 |
| JP | 2845163 | 1/1999 |
| JP | 2001-15698 | 1/2001 |
| JP | 2001342570 | 12/2001 |
| JP | 2004014952 | 1/2004 |
| JP | 2004091848 | 3/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010097834 | 4/2010 |
| JP | 2010205967 | 9/2010 |
| JP | 2010251444 | 10/2010 |
| JP | 2012089837 | 5/2012 |
| JP | 2012146939 | 8/2012 |
| JP | 2013235912 | 11/2013 |
| JP | 2014522104 | 8/2014 |
| KR | 10-0295043 | 4/2001 |
| KR | 10-2002-0064028 | 8/2002 |
| KR | 10-0377095 | 3/2003 |
| KR | 10-2005-0054122 | 6/2005 |
| KR | 10-0547248 | 1/2006 |
| KR | 10-0593960 | 6/2006 |
| KR | 10-0688484 | 2/2007 |
| KR | 10-2007-0084683 | 8/2007 |
| KR | 10-2009-0055443 | 6/2009 |
| KR | 20100020834 | 2/2010 |
| KR | 20100032812 | 3/2010 |
| KR | 10-1114219 | 2/2012 |
| TW | I226380 | 1/2005 |
| TW | 200701301 | 1/2007 |
| WO | 1998032893 | 7/1998 |
| WO | 2004008827 | 1/2004 |
| WO | 2004010467 | 1/2004 |
| WO | 2006054854 | 5/2006 |
| WO | 2006056091 | 6/2006 |
| WO | 2006078666 | 7/2006 |
| WO | 2006080782 | 8/2006 |
| WO | 2006101857 | 9/2006 |
| WO | 2006114781 | 11/2006 |
| WO | 2007027165 | 3/2007 |
| WO | 2007140376 | 12/2007 |
| WO | 2008091900 | 7/2008 |
| WO | 2009154889 | 12/2009 |
| WO | 2010039363 | 4/2010 |

(56) References Cited

FOREIGN PATENT DOCUMENTS

| WO | 2010118051 | 1/2011 |
| --- | --- | --- |
| WO | 2011019950 | 2/2011 |
| WO | 2011149640 | 12/2011 |
| WO | 2013078065 | 5/2013 |
| WO | 2013078066 | 5/2013 |
| WO | 2015107009 | 7/2015 |
| WO | 2017108714 | 6/2017 |

OTHER PUBLICATIONS

USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 24, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.

(56) References Cited

OTHER PUBLICATIONS

USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Non-Final Office Action dated Apr. 26, 2017 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Notice of Allowance dated Mar. 28, 2016 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Jan. 10, 2013 in U.S. Appl. No. 13/339,609.
USPTO; Office Action dated Feb. 11, 2013 in U.S. Appl. No. 13/339,609.

(56) References Cited

OTHER PUBLICATIONS

USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO;; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 27, 2014 in U.S. Appl. No. 13/604,498.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Non-Final Office Action dated Jun. 2, 2016 in U.S. Appl. No. 13/646,471.
USPTO; Non-Final Office Action dated May 28, 2015 in U.S. Appl. No. 13/651,144.
USPTO; Final Office Action dated Nov. 19, 2015 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Non-Final Office Action dated May 17, 2017 in U.S. Appl. No. 13/651,144.
USPTO; Non-Final Office Action dated Jun. 18, 2015 in U.S. Appl. No. 13/665,366.

(56) References Cited

OTHER PUBLICATIONS

USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Non-Final Office Action dated May 25, 2016 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Non-Final Office Action dated Aug. 11, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Non-Final Office Action dated Jul. 30, 2015 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.

(56) References Cited

OTHER PUBLICATIONS

USPTO; Notice of Allowance dated Nov. 17, 2015 in U.S. Appl. No. 14/031,982.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Feb. 11, 2016 U.S. Appl. No. 14/090,750.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Restriction Requirement dated May 20, 2016 in U.S. Appl. No. 14/218,690.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Non-Final Office Action dated Nov. 25, 2015 in U.S. Appl. No. 14/219,879.
USPTO; Non-Final Office Action dated Dec. 23, 2016 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Non Final Office Action dated Aug. 12, 2016 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Non-Final Office Action dated Oct. 20, 2015 in U.S. Appl. No. 14/281,477.
USPTO; Non-Final Office Action dated Jan. 13, 2017 in U.S. Appl. No. 14/444,744.
USPTO; Non-Final Office Action dated May 18, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Final Office Acton dated Jun. 17, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Sep. 16, 2016 in U.S. Appl. No. 14/465,252.
USPTO; Final Office Action dated Jan. 1, 2016 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.

(56) References Cited

OTHER PUBLICATIONS

USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Non-Final Office Action dated Mar. 3, 2016 in U.S. Appl. No. 14/622,603.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO;Notice of Allowance dated Mar. 25, 2016 in U.S. Appl. No. 14/693,138.
USPTO; Final Office Acton dated Sep. 30, 2016 in U.S. Appl. No. 14/808,979.
USPTO; Non-Final Office Action dated Mar. 30, 2016 in U.S. Appl. No. 14/808,979.
USPTO; Non-Final Office Action dated Dec. 20, 2016 in U.S. Appl. No. 14/808,979.
USPTO; Non-Final Office Action dated Sep. 1, 2016 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Non-Final Office Action dated Jul. 29, 2016 in U.S. Appl. No. 14/884,695.
USPTO; Non-Final Office Action dated May 18, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Dec. 15, 2016 in U.S. Appl. No. 14/938,180.
USPTO; Non-Final Office Action dated Apr. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Non-Final Office Action dated Jan. 12, 2017 in U.S. Appl. No. 14/981,468.
USPTO; Non-Final Office Action dated Mar. 22, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Apr. 13, 2017 in U.S. Appl. No. 15/144,506.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Non-Final Office Action dated Nov. 28, 2016 in U.S. Appl. No. 15/203,632.
USPTO; Non-Final Office Action dated Jun. 1, 2017 in U.S. Appl. No. 15/205,827.
USPTO; Non Final Office Action dated Apr. 21, 2017 in U.S. Appl. No. 15/222,715.
USPTO; Non-Final Office Action dated Feb. 3, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Apr. 12, 2017 in U.S. Appl. No. 15/397,319.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
PCT; International Search report and Written Opinion dated Nov. 12, 2010 in Application No. PCT/US2010/030126.

(56) References Cited

OTHER PUBLICATIONS

PCT; International Preliminary Report on Patentability dated Oct. 11, 2011 Application No. PCT/US2010/030126.
PCT; International Search report and Written Opinion dated Jan. 20, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Office Action dated May 24, 2013 in Application No. 201080036764.6.
Chinese Patent Office; Office Action dated Jan. 2, 2014 in Application No. 201080036764.6.
Chinese Patent Office; Office Action dated Jul. 1, 2014 in Application No. 201080036764.6.
Chinese Patent Office; Office Action dated Feb. 8, 2014 in Application No. 201110155056.
Chinese Patent Office; Office Action dated Sep. 16, 2014 in Application No. 201110155056.
Chinese Patent Office; Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Korean Patent Office; Office Action dated Dec. 10, 2015 in Application No. 10-2010-0028336.
Taiwan Patent Office; Office Action dated Jul. 4, 2014 in Application No. 099110511.
Taiwan Patent Office; Office Action dated Dec. 19, 2014 in Taiwan Application No. 099127063.
Taiwan Patent Office; Office Action dated May 13, 2016 in Taiwan Application No. 101142582.
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Coates, "Process Analytical Technology: Spectroscopic Tools and Implementation Strategies for the Chemical and Pharmaceutical Industries." Blackwell Publishing Ltd, 91-132, (2005).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Harrison et al., "Poly-gate Replacement Through Contact Hole (PRETCH): A New Method for High-K/ Metal Gate and Multi-Oxide Implementation on Chip," IEEE (2004).
Heo et al., "Structural Characterization of Nanoporous Low-Dielectric Constant SiCOH Films Using Organosilane Precursors," NSTI-Nanotech, vol. 4, 122-123 (2007).
H.J. Yun et al., "Comparison of Atomic Scale Etching of Poly-Si in Inductively Coupled Ar and He Plasmas", Korean Journal of Chemical Engineering, vol. 24, 670-673 (2007).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).
Jones et al., "Growth of Aluminium Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. Of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperaure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).
King, Plasma Enhanced Atomic Layer Deposition of SiNx: H and SiO2, J. Vac. Sci. Technol., A29(4) (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).

(56) References Cited

OTHER PUBLICATIONS

Koutsokeras et al. "Texture and Microstructure Evolution in Single-Phase TixTal-xN Alloys of Rocksalt Structure," Journal of Applied Physics, 110, pp. 043535-1-043535-6, (2011).
Knoops et al., "Atomic Layer Deposition of Silicon Nitride from Bis(tert-butyloamino) silane and N2 Plama," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Kurosawa et al., "Synthesis and Characterization of Plasma-Polymerized Hexamethyldisiloxane Films," Thin Solid Films, 506-507, 176-179 (2006).
Lanford et al., "The Hydrogen Content of Plasmadeposited Silicon Nitride," J. Appl. Phys., 49, 2473 (1978).
Lee et al., Layer Selection by Multi-Level Permutation in 3-D Stacked NAND Flash Memory, IEEE Electron Device Letters, vol. 37, No. 7, 866-869 (2016).
Lieberman, et al., "Principles of Plasma Discharges and Materials Processing," Second Edition, 368-381.
Lim et al., "Low-Temperature Growth of SiO2 Films by Plasma-Enhanced Atomic Layer Deposition," ETRI Journal, 27 (1), 118-121 (2005).
Liu et al., "Research, Design, and Experimen of End Effector for Wafer Transfer Robot," Industrial Robot: An International Journal, 79-91 (2012).
Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Maeng et al. Electrical properties of atomic layer disposition Hf02 and Hf0xNy on Si substrates with various crystal orientations, Journal of the Electrochemical Society, 2008-04, p. H267-H271, vol. 155, No. 4, Department of Materials Science and Engineering, Pohang University of Science and Technology, Pohang, Korea.
Marsik et al., "Effect of Ultraviolet Curing Wavelength on Low-k Dielectric Material Proerties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2A1)2O]n and (RAlO)n," J. American Chemical Society, vol. 115, No. 12, pp. 4971-4984 (1993).
Massachusetts Institute of Technology Lincoln Laboratory, "Solid State Research," Quarterly Technical Report (1995).
Meng et al., "Atomic Layer of Deposition of Silicon Nitride Thin Films: A Review of Recent Progress, Challenges, and Outlooks," Materials, 9, 1007 (2016).
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982),.
Mukai et al., "A Study of CD Budget in Spacer Patterning Technology," Proc. Of SPIE, 6924, 1-8 (2008).
Nigamananda et al., "Low-Temperature (<200oC.) Plasma Enhanced Atomic Deposition of Dense Titanium Nitride Thin Films.".
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
S. Okamoto et al., "Luminescent Properties of Pr3+—sensitized LaPO4: Gd3+ Ultraviolet-B Phosphor Under Vacuum-Ultraviolet Light Excitation," J. App. Phys. 106, 013522 (2009).

Park "Substituted Aluminum Metal Gate on High-K Dielectric for Low Work-Function and Fermi-Level Pinning Free," 4 pages, IEEE 0-7803-8684-1/04 (2004).
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Presser, et al., "Effect of Pore Size on Carbon Dioxide Sorption by Carbide Derived Carbon," Energy & Environmental Science 4.8, 3059-3066 (2011).
Provine et al., "Correlation of Film Density and Wet Etch Rate in Hydrofluoric Acid of Plama Enhanced Atomic Layer Deposited Silicon Nitride," AIP Advances, 6 (2016),.
Radamson et al. "Growth of Sn-alloyed Group IV Materials for Photonic and Electronic Applications", Chapter 5 pp. 129-144, Manufacturing Nano Structures.
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Sathees et al., "Selective Atomic Layer Deposition of Zirconia on Copper Patterened Silicon Substrates Using Ethanol as Oxygen Source as Well as Copper Reductant," J. Vac. Sci. Technol. A32(1), (2014).
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
S.D. Athavale and D.J. Economou, "Realization of Atomic Layer Etching of Silicon", Journal of Vacuum Science and Technology B, vol. 14, year 1996, pp. 3702-3705.
Shamma et al., "PDL Oxide Enabled Doubling," Proc. Of SPIE, 6924, 69240D, 1-10 (2008).
Varma, et al., "Effect of Metal Halides on Thermal, Mechanical, and Electrical Properties of Polypyromelitimide Films," Journal of Applied Polymer Science, vol. 32, pp. 3987-4000, (1986).
Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).
Wirths, et al, "SiGeSn Growth tudies Using Reduced Pressure Chemical Vapor Deposition Towards Optoeleconic Applications," This Soid Films, 557, 183-187 (2014).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0/7803-9269—Aug. 2005 (2005).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Chemistry Stack Exchange, "Why is CF4 Non-Polar and CHF Polar,"https://chemistry.stackexchange.com/questions/31604/why-is-cf4-non-polar-and-chf3-polar, (2015).
USPTO; Non Final Office Action dated Mar. 12, 2018 in U.S. Appl. No. 14/090,750.

(56) References Cited

OTHER PUBLICATIONS

USPTO; Non-Final Office Action dated Mar. 27, 2018 in U.S. Appl. No. 14/219,839.
USPTO; Final Office Action dated Mar. 28, 2018 in U.S. Appl. No. 14/444,744.
USPTO; Non-Final Office Action dated Mar. 21, 2018 in U.S. Appl. No. 14/752,712.
USPTO; Final Office Action dated Mar. 29, 2018 in U.S. Appl. No. 14/793,323.
USPTO; Final Office Action dated Mar. 14, 2018 in U.S. Appl. No. 14/808,979.
USPTO; Non-Final Office Action dated Feb. 23, 2018 in U.S. Appl. No. 14/817,953.
USPTO; Final Office Action dated Mar. 5, 2018 in U.S. Appl. No. 14/829,565.
USPTO; Final Office Action dated Feb. 6, 2018 in U.S. Appl. No. 14/997,683.
USPTO; Non-Final Office Action dated Feb. 20, 2018 in U.S. Appl. No. 15/060,412.
USPTO; Non-Final Office Action dated Apr. 4, 2018 in U.S. Appl. No. 15/592,730.
King et al., "Atomic Layer Deposition of Amorphous Niobium Carbide-Based Thin Film Superconductors" The Journal of Physical Chemistry, 115, pp. 25063-25071 (2011).
Voltaix, "Trisilylamine", Material Safety Data Sheet (2014).

\* cited by examiner

APPARATUS AND METHOD FOR MANUFACTURING A SEMICONDUCTOR DEVICE

FIELD

The present invention generally relates to apparatus and methods to manufacture semiconductor devices. More particularly, the invention relates to an apparatus comprising:

a reaction chamber provided with a substrate holder for holding a substrate; and, a heater for heating the substrate.

BACKGROUND

High-temperature furnaces, functioning as reactors, may be used as a reaction chamber to create fine dimension structures, such as integrated circuits, on a semiconductor substrate. Several substrates, such as silicon wafers, may be placed on a substrate holder, such as a substrate rack or boat inside the reactor. Alternatively, a single substrate may be placed on a substrate holder such as a substrate susceptor inside the reactor. Both the substrate and holder may be heated to a desired temperature. In a typical substrate treatment step, reactant gases are passed over the heated substrate, causing the deposition of a thin layer of the reactant material or reactants of the gases on the substrate.

A series of such treatment steps on a substrate is called a recipe. If the deposited layer has the same crystallographic structure as the underlying silicon substrate, it is called an epitaxial layer. This is also sometimes called a monocrystalline layer because it has only one crystal structure. Through subsequent deposition, doping, lithography, etch and other processes, these layers are made into integrated circuits, producing from tens to thousands or even millions of integrated devices, depending on the substrate size and the circuits' complexity.

Various process parameters are carefully controlled to ensure the high quality of the resulting layers. One such critical parameter is the substrate temperature during each recipe step. During CVD, for example, the deposition gases react within particular temperature windows and deposit on the substrate. Different temperatures also result in different deposition rates. Accordingly, it is important to accurately control the substrate temperature to bring the substrate to the desired temperature before the treatment begins.

One factor which critically affects the throughput of a processing reactor is the substrate temperature ramp rate. Such temperature ramping can be required at several points during a given recipe. For example, a cold substrate must be heated to the appropriate treatment temperature. Also, the recipe may require different temperatures for different treatment steps. At the recipe's end, the substrate ordinarily is cooled to a level that the substrate handling device can tolerate. The heating and cooling steps can represent a significant percentage of the processing time and can limit the reactor's throughput. The time between the steady state temperatures is essentially time which should be minimized so as to increase the reactor's throughput.

Accordingly, there may be a need for controlling substrate temperatures with a high power and controllability.

SUMMARY

In accordance with at least one embodiment of the invention, there is provided an apparatus for manufacturing a semiconductor device comprising:

a reaction chamber provided with a substrate holder for holding a substrate; and, a heater for heating the substrate; wherein the heater comprises a vertical cavity surface emitting laser constructed and arranged to emit a radiation beam to a substrate held by the substrate holder.

Vertical cavity surface emitting lasers (VCSELs) are capable of generating enough power in the radiation to provide a steep ramp of the temperature in the substrate. Vertical cavity surface emitting lasers are semiconductor devices with a very high controllability by their short switch on/switch off times. The radiation beams emitted by the vertical cavity surface emitting lasers show a very small divergence angle so that the VCSEL allows for a very good power control at some distance of the VCSEL.

In accordance with a further embodiment of the invention there is provided a method for producing a semiconductor device, comprising:

providing a substrate; and heating the substrate with a vertical cavity surface emitting laser.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

Although certain embodiments and examples are disclosed below, it will be understood by those in the art that the invention extends beyond the specifically disclosed embodiments and/or uses of the invention and obvious modifications and equivalents thereof Thus, it is intended that the scope of the invention disclosed should not be limited by the particular disclosed embodiments described below.

VCSEL for Heating a Stack of Substrates

Figure 1:
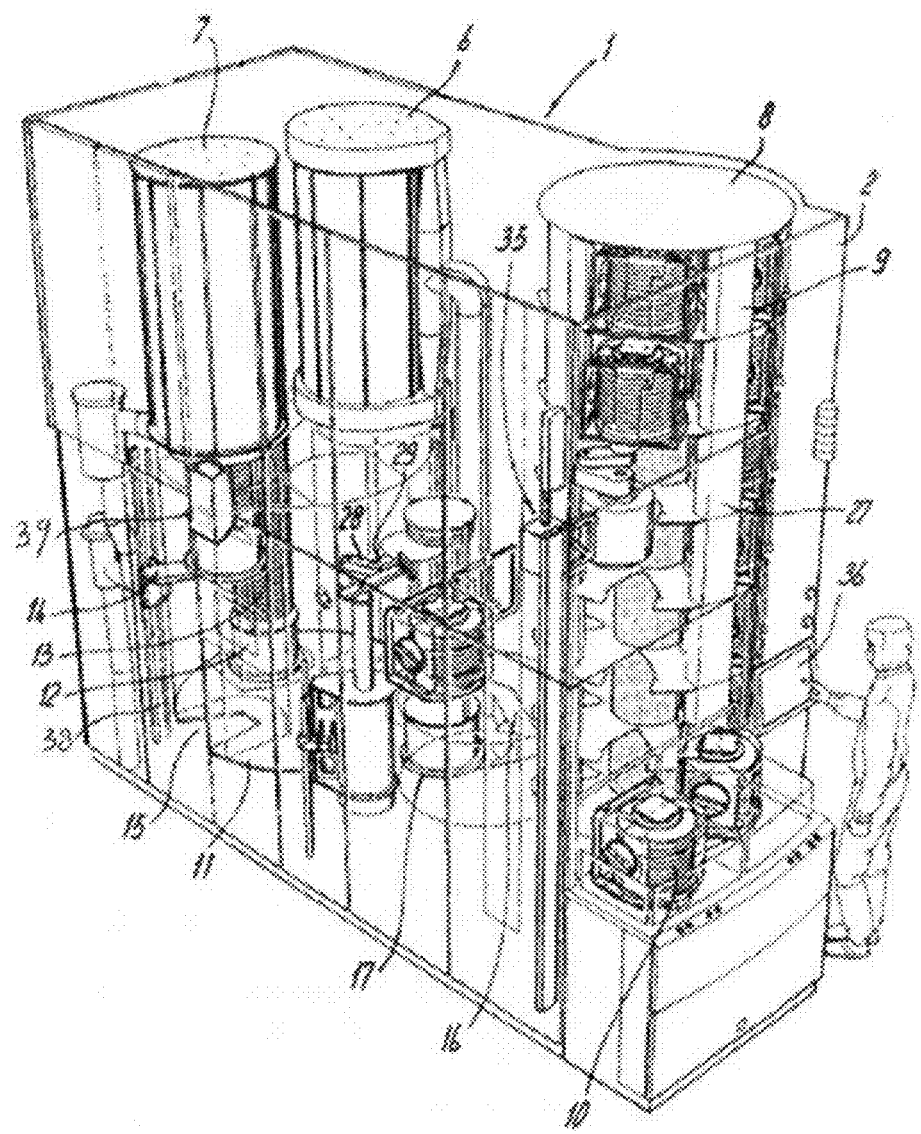
FIG. 1 shows, diagrammatically and partially exposed, a perspective view of the apparatus for application of a vertical cavity surface emitting laser according to the invention.
Figure 2:
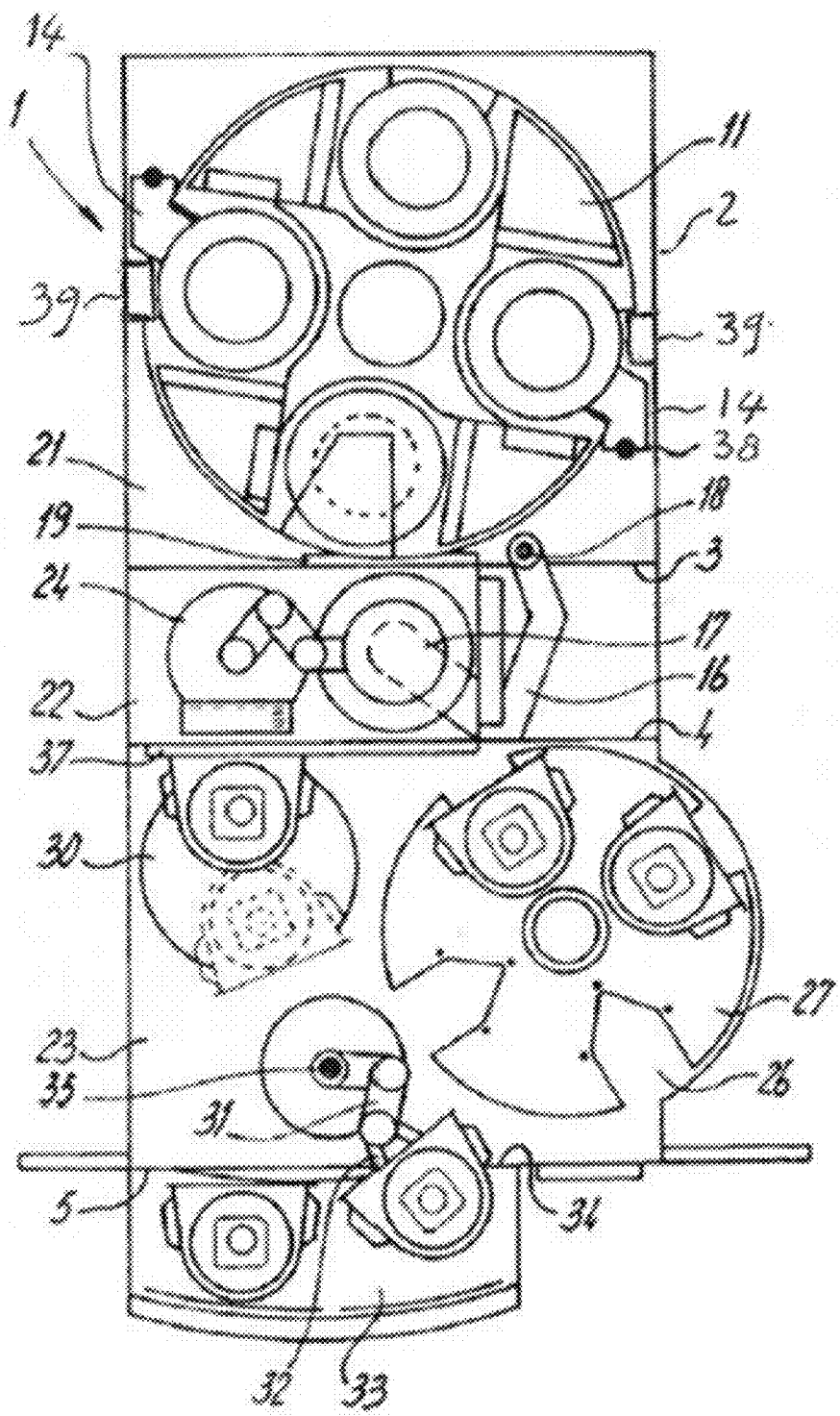
FIG. 2 shows, diagrammatically, a plan view of the apparatus according to FIG. 1.

An apparatus 1 comprising a vertical cavity surface emitting laser VCSEL according to the invention may be indicated in FIGS. 1 and 2. Said apparatus 1 comprises a housing 2 and may in general be installed partially or completely in a so-called "clean room." In addition to housing 2, partitions 3, 4 and 5 may be present, as can be seen in particular from FIG. 2. Housing 2 delimits, with partition 3, reactor area 21. A substrate handling chamber 22 is delimited between housing 2 and partitions 3, 4. A cassette handling chamber 23 is delimited between partitions 4 and 5 and housing 2. The apparatus 1 further comprises a cassette introduction portion 33.

Two reactor chambers, e.g. furnaces 6, 7, provided with heaters are arranged in reactor area 21. Said furnaces are positioned vertically and substrate racks, indicated by 12, filled with substrates 13, may be introduced into the furnaces 6, 7 in the vertical direction from below. To this end each furnace has a rack handler comprising an insertion arm 14, which is movable in the vertical direction with the aid of a spindle 38. Only one insertion arm 14 can be seen in the drawing of FIG. 1. In FIG. 2 it is indicated that there are two insertion arms 14 on both sides of the apparatus. The substrate rack 12 is provided at the bottom with an insulating plug, which is not indicated in more detail, which provides a seal with respect to the furnace.

The rack handler further comprises a rotary platform 11, provided with cut-outs 15, arranged in the reaction area 21. Said cut-outs 15 are shaped such that, if the cut-outs 15 have been brought into the correct position, arm 14 is able to move up and down through the cut-outs. On the other hand, the diameter of the bottom of the substrate rack is such that said diameter is larger than the cut-out 15 in the platform 11, so that when the arm 14 moves downwards from the position shown in FIG. 1, the substrate rack 12 may be placed on rotary platform 11 and may be removed therefrom again in a reverse operation.

The substrate racks 12 can be fed to both furnace 6 and furnace 7 with the rack handler. It is possible to perform a successive treatment therein. It is also possible to allow parallel groups of substrate racks 12 to be treated exclusively by furnace 6 and exclusively by furnace 7. Said substrate racks 12 may be provided with substrates 13.

Substrates 13 may be supplied in (transport) cassettes 10, which, from the cassette introduction portion 33, may be placed in store 8 through a closable opening 34 with the aid of arm 31 of the cassette handling robot 35. Arm 31 may be provided with a bearing surface 32, which has dimensions a little smaller than those of the series of cut-outs 26 in rotary platforms 27. A number of such rotary platforms are provided one above the other in the vertical direction in store 8. Arm 31 is movable in the vertical direction with the aid of cassette handling robot 35. Arm 31 is mounted such that said arm is able not only to pick up or remove cassettes from or to introduction portion 33 to or from store 8, but also to make it possible to move cassettes from or to store 8 to or from rotary platform 30.

Said rotary platform 30 is constructed such that on rotation the cassette is placed against partition 4 where an opening 37 has been made so that, after opening the cassettes, substrates can be taken one by one from the cassette concerned with the aid of arm 24 of a substrate handler and can be placed in the substrate rack 12 located in substrate handling chamber 22. Said substrate rack 12 is supported by a hinged arm 16 being part of the rack handler and provided with a bearing surface 17 at the end, the dimensions of which are somewhat smaller than those of cut-outs 15 of rotary platform 11. Said arm 16 is able to move with the substrate rack through a closable opening in partition 3 by rotation about rotation point 18. A closure is provided in order to be able to close opening 19 between reaction area 21 and substrate handling chamber 22.

An operator or an automated cassette transport system (not shown), may load store 8 by introducing a number of cassettes on introduction portion 33. Control operations may be done on panel 36. Cassettes 10 may be transferred from the introduction portion 33 with the aid of arm 31 into the storage compartments 9 made for these cassettes in store 8. By starting from the lowest position for removing the relevant cassette 10 from portion 33 through the opening 34, said cassette can be moved upwards for moving into a higher compartment 9 of the store 8 by the cassette handling robot 35. By rotation of the store 8, it is possible to fill various compartments 9 with cassettes 10.

The cassettes 10 concerned may be removed from the store by arm 31 and placed on rotary platform 30. The cassettes are rotated on the rotary platform 30 and placed with their door against partition 4. The door of the cassette may be removed with a door opener. With the aid of arm 24, the substrates may be removed substrate by substrate and placed in substrate rack 12 placed on swing arm 16 with the substrate handler.

In the interim the rotary platform 11 may be able to move in the reactor area 21 in an optimum manner with regard to the treatments to be carried out on the substrates present inside the reactor area 21. After substrate rack 12 has been filled in the substrate handling chamber 22 and may become available to one of the reactors 6, 7, opening 19, which was closed up to this time, is opened and said freshly filled substrate rack 12 may be placed on rotary platform 11. Said rotary platform 11 may then move one position and the filled substrate rack 12 may be removed from platform 11 with the help of insertion arm 14 into the furnace 6,7. Treated substrates in a finished rack may be lowered on said filled platform 11. Said substrates execute a movement counter to the above to end up in the cassettes.

The substrate rack 12 with the fresh substrate fed to furnace 6 or furnace 7 with the insertion arms 14 provided to each furnace 6, 7 may be treated in said furnace. It is possible to perform a successive treatment in the furnace 6, 7. The treatment may comprise an increase of the temperature of the substrates in the rack 12. Especially, if the treatment requires a relatively high temperature this increase in the temperature may require a long time. The rate at which the substrate temperature can change from one steady state to another depends on the reactor's ramp rate.

The apparatus may have a preheater e.g. vertical cavity surface emitting laser 39 for heating the substrates 13 in the rack 12 with a laser beam directed towards the substrates 13 to decrease the heating time. The rack 12 may be introduced into the furnaces 6, 7 functioning as a final heater in the vertical direction from below by the aid of the insertion arm 14, which is movable in the vertical direction with the aid of the spindle 38. During this movement the substrates 13 may be moved along the vertical cavity surface emitting laser 39. The vertical cavity surface emitting laser 39 may be capable of generating enough power in the laser beams to provide a ramp of the temperature in the substrates 13 when they pass along the vertical cavity surface emitting laser 39 during the movement. The vertical cavity surface emitting lasers 39 may be arranged in an array.

The array of vertical cavity surface emitting lasers 39 functioning as the pre-heater may have a length in the vertical direction which is less than the length of the rack 12 in the vertical direction. Even more preferably the pre-heater may have a length in the vertical direction which is less than $\frac{2}{3}^{rd}$, half, or even $\frac{1}{3}^{rd}$ of the length of the rack 12 in the vertical direction.

Only one vertical cavity surface emitting laser 39 can be seen in the drawing of FIG. 1. As shown in FIG. 2 there may be two vertical cavity surface emitting lasers 39 each for working with one of the furnaces 6, 7. Alternatively two or more vertical cavity surface emitting lasers may be positioned below a single furnace 6, 7 to increase the uniformity of the heating.

The substrate rack 12 may be provided at the bottom with an insulating plug, which provides a seal with respect to the furnace 6, 7 when the rack 12 is moved upward in the furnace 6, 7. To increase the uniformity of the preheating by the vertical cavity surface emitting laser 39 the insulating plug may be provided with a rack rotation device for rotating the rack 12 with substrates 13 around a vertical axis during heating of the substrates 13 in the rack 12 by the vertical cavity surface emitting lasers 39. Rack rotation devices may be known from U.S. Pat. No. 9,018,567 B2 incorporated herein by reference.

Figure 3:
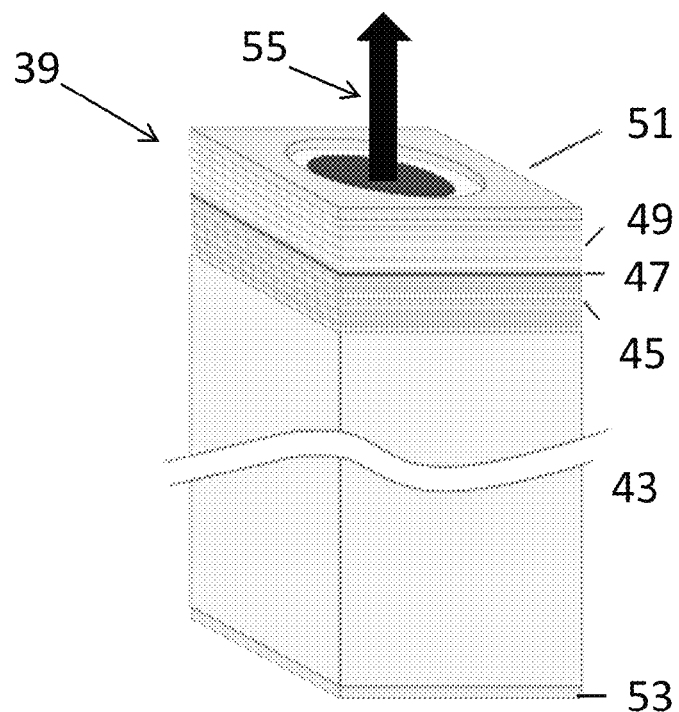
FIG. 3 shows the vertical cavity surface emitting laser.

FIG. 3 shows a vertical cavity surface emitting laser (VCSEL) 39 for use in the apparatus of FIGS. 1 and 2. The vertical cavity surface emitting laser 39 may comprise a crystalline substrate 43, a lower multiple layer interference mirror 45 (e.g. a brag reflector) epitaxial formed on said substrate, an active zone 47 comprising at least one quantum well layer epitaxial formed on said lower mirror and lasing a predetermined wavelength, and an upper multiple layer interference mirror 49 (e.g. a brag reflector) epitaxial formed on said active zone. The layers being arranged in a vertical direction.

A lower and an upper spacer region is interposed between said active zone 47 and respective ones of said mirrors 45, 49 and epitaxial therewith to provide a vertical optical cavity between opposing faces of said mirrors separated by an optical distance of a predetermined relationship to said wavelength. Said active zone 47, said upper spacer region and said upper mirror are formed into a vertical waveguiding region having a substantially constant cross-section area and a first effective dielectric constant below said upper mirror 49. The laser further comprising: a medium laterally substantially surrounding said waveguiding region and having a second dielectric constant less than said first effective dielectric constant.

Two electrical contact regions are provided, one electrical contact region 51 being electrically connected to said waveguiding region above said active zone 47 and another electrical contact region 49 being electrically connected to said waveguiding region below said active zone 47. Electrical power applied to said contact regions causes said laser to lase at said wavelength by creating a standing wave between the opposing faces of said mirrors 45, 49.

Radiation beam 55 is escaping vertical cavity surface emitting laser 39 because the upper multiple layer interference mirror 49 is not 100% reflective. By tuning the distance between the lower and upper mirrors 45, 49 the wavelength of the radiation beam 55 can be tuned.

The vertical cavity surface emitting laser 39 may emit infrared radiation 55 with a wavelength between 800 nm and 1100 nm, preferably around 808 nm, 850 nm or 980 nm. These wavelengths may optimally be absorbed by the substrate irradiated with the radiation beam 55. The vertical cavity surface emitting laser 39 may heat the substrate to a temperature between 50 and 1200° C., preferably between 100 and 900° C. and more preferably between 150 and 600° C.

Figure 4:
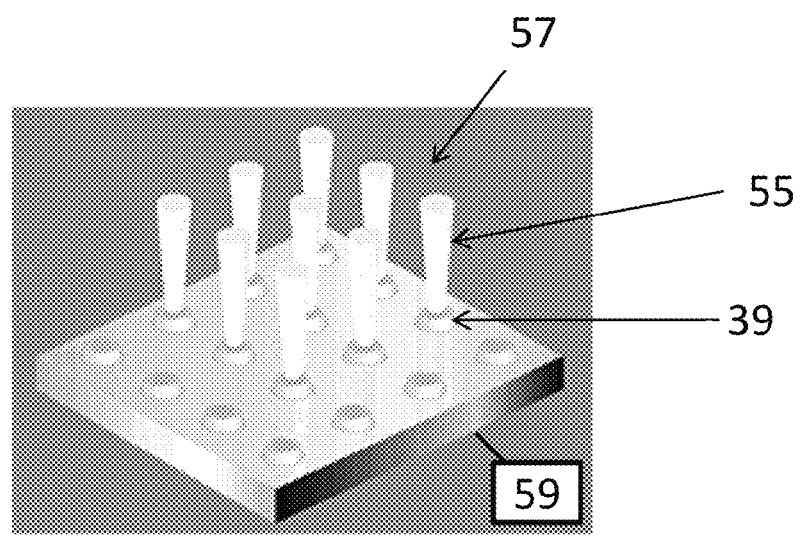
FIG. 4 shows multiple vertical cavity surface emitting lasers of FIG. 3 in an array.

FIG. 4 shows multiple vertical cavity surface emitting lasers 39 provided in an VCSEL array 57 to emit radiation beams 55 in the direction of the substrate. In the VCSEL array 57 the individual power of the individual vertical cavity surface emitting lasers 39 in the VCSEL array 57 may be controlled with the power controller 59 individually to adjust the power output of the radiation beams 55. The vertical cavity surface emitting laser combines a high energy density with a high controllability. The controllability is high because the vertical cavity surface emitting lasers 39 provides a very narrow directional radiation beam 55 and the vertical cavity surface emitting lasers 39 allow for a very fast switching of the radiation beams 55 with a narrow spectrum and allow for dimming. The vertical cavity surface emitting laser 39 is a solid state device and therefore has a very long lifetime. The VCSEL array 57 of vertical cavity surface emitting lasers 39 for emitting radiation in the direction of the substrate may have a power output between 10 W/cm²-40 kW/cm², preferably 100 W/cm²-10 kW/cm² and even more preferably around 1 kW/cm².

In high temperature film deposition or annealing processes, a substrate must be heated to a predetermined temperature after it is introduced into the reaction chamber e.g. furnace 6, 7. In current chemical vapor deposition reactors, the substrate may be typically at room temperature when it is loaded into the reaction chamber, which is still at a much higher temperature, perhaps as high as 900° C.

When the substrate is loaded in the reaction chamber the substrate experiences a thermal shock. The thermal effect experienced by the substrate usually varies throughout the extent of the substrate, that is to say that there are large thermal gradients, which may be difficult to mitigate. This can lead to substrate warping and breakage and also to poor uniformity and quality of deposited films.

There may be a need for substrate exchange in high temperature reaction chambers that reduces the thermal shock experienced by the substrate without adversely affecting process throughput, and instead enhancing throughput. The vertical cavity surface emitting laser may be constructed and arranged to heat the substrates before the substrate is loaded in the reaction chamber.

The vertical cavity surface emitting laser may be constructed and arranged to heat the substrates in the reactor area 21 as a pre-heater. The insertion arms 14 of the rack handler may be used to move the rack 12 with substrates from the pre-heater to a final heater, for example in the reactors e.g. furnaces 6, 7 where the substrate may heated to or controlled at the final temperature.

Figure 5:
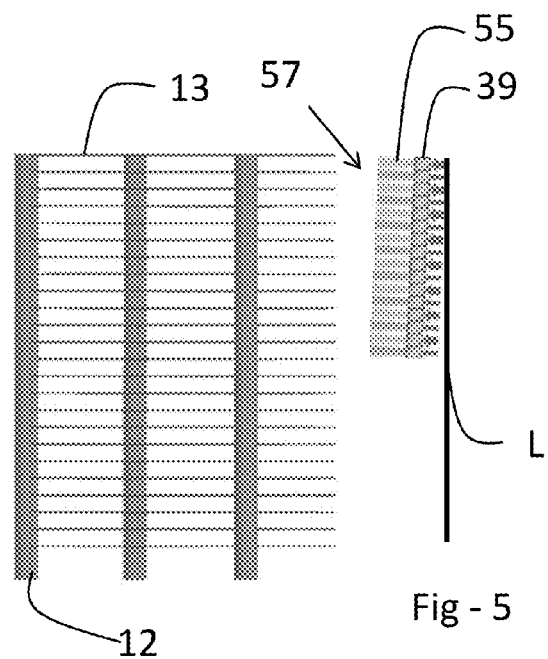
FIG. 5 depicts a side view on a substrate rack for carrying multiple substrates heated by the array of FIG. 4.

FIG. 5 depicts a substrate rack 12 for holding a plurality of substrates 13 in a spaced apart relationship. The substrate rack 12 comprises at least one support member (e.g. three struts 61) defining a plurality of spaced apart substrate holding provisions, each of which substrate holding provisions is configured to independently hold a substrate 13 in a substantially horizontal orientation.

The VCSEL array 57 of vertical cavity surface emitting lasers 39 for emitting radiation beams 55 in the direction of the substrate 13 may be positioned on a side of the rack 12. The VCSEL array 57 may radiate radiation beams from the side upward towards the bottom of the substrate 13. The angle of the radiation beams 55 may be between 60 to 90° preferably between 80 to 89.5° and even more preferably between 85 and 89° with respect to a line L perpendicular to the surface of the substrate 13.

Although the radiation beam 55 of the vertical cavity surface emitting laser 39 is very parallel they may be still emitted with a (very) small angle. The direction of the radiation beam 55 is therefore defined as the average direction of the radiation emitted by the vertical cavity surface emitting laser 39.

Reflectors may be applied on the other side of the substrate rack to reflect radiation reflected of the substrates 13 back to the substrate rack. The reflectors may be retroreflectors to reflect the radiation beam back in the same direction as from which the radiation beam came.

Figure 6:
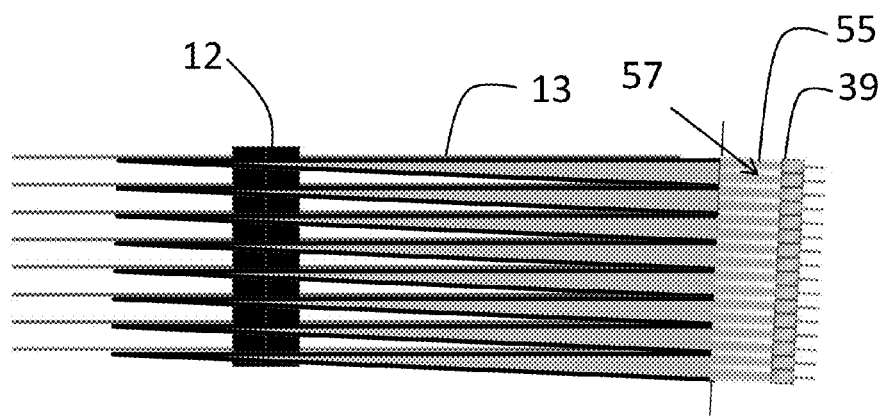
FIG. 6 depicts a portion of the substrate rack of FIG. 5 being heated by the array of FIG. 4; and, FIG. 7 depicts a top view on a substrate being heated in the substrate rack of FIG. 5.

FIG. 6 depicts a portion of the substrate rack 12 for carrying multiple substrates 13 of FIG. 5. By having the radiation beams 55 of the VCSEL array 57 emitted in a direction slightly off-axis and upward to the surface of the substrate 13 it is assured that the substrate 13 is heated from the bottom upwards which may be better because sensitive features may be on the top surface of the substrate 13.

Figure 7:
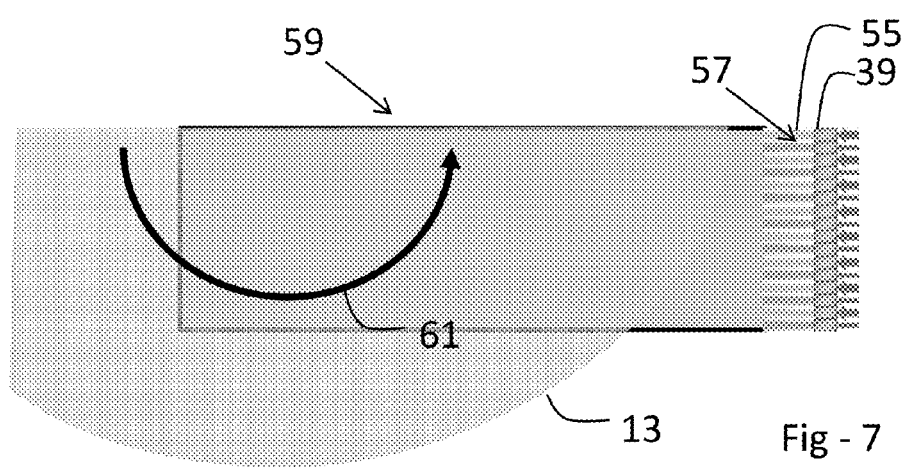

FIG. 7 depicts a top view on a substrate 13 in the substrate rack. By having the VCSEL array 57 heating the substrates 13 from the side only a portion 59 of the substrate 13 is directly heated. By rotating the substrate 13 with a rotation device in a direction as depicted by the arrow 61 it is assured that the substrate 13 is evenly heated. A rotational motor in the rotation device may be used to rotate the rack with substrates 13 and to uniformly heat the substrate 13.

Alternatively, the vertical cavity surface emitting laser may be constructed and arranged to heat a substrate in reactors e.g. furnace 6, 7 and function as final heaters. A reactor wall that allows for the transmission of the radiation beam 55 through the reactor wall may therefore be necessary. The reactor wall may be made from glass for this purpose.

VCSEL for Heating a Single Substrate

The VCSEL array 57 of vertical cavity surface emitting lasers 39 for emitting radiation beams 55 may also be used to be heat individual substrates in a single substrate reaction chamber. For example, VCSEL array 57 may be used in a single substrate chemical vapor deposition (CVD) apparatus. Such a chemical vapor deposition apparatus may comprise:

a reaction chamber;

a substrate holder e.g. a susceptor disposed within the chamber for supporting a substrate to be processed on a top surface;

a plurality of vertical cavity surface emitting lasers 39 located on the surface of the reaction chamber, each configured to emit radiant energy with radiation beam 55 towards the top surface of the susceptor. The vertical cavity surface emitting lasers 39 may be heating the substrate from underneath the substrate or optionally from above the substrate as well. The apparatus may have a controller configured to adjust the radiant energy emitted by at least one of the plurality of vertical cavity surface emitting lasers 39 relative to another one of the plurality of vertical cavity surface emitting lasers 39 so as to uniformly heat the substrate.

A reflector or radiation redistributor may be located between the plurality of vertical cavity surface emitting lasers 39 and the susceptor. The purpose of the reaction chamber configuration and the controller 59 may be to provide an environment that, to the extent possible, provides uniform radiation for the substrate and the associated susceptor. When the radiation is uniform, the temperature of the substrate-susceptor combination will be uniform to the extent that thermal losses are also uniform. The surface of the reactor may be coated with a reflecting material on the inside, such as a gold plating.

Openings in the reaction chamber may be used for introducing reaction gas in the reaction chamber. Details about the chemical vapor deposition reaction chamber may be disclosed in U.S. Pat. No. 6,191,399, which is incorporated by reference herein. Details about the susceptor may be found in U.S. Pat. No. 6,068,441, issued May 30, 2000, which is included by reference herein.

The function of the reaction chambers may be to provide an epitaxial reactor. Because of the necessity for introducing and removing gas with the deposition materials, as well as the necessity for introducing and removing the substrate itself, the reactor chamber may have openings for accomplishing the associated functions. In high temperature film deposition or annealing processes, a substrate must be heated to a predetermined temperature after it is introduced into the reaction chamber.

For example, in epitaxy processes, the temperature may be typically around 1090° C. to 1190° C. This substrate heating can be effected by conduction through direct contact with a heated susceptor, or by radiation through the use of heating lamps e.g. vertical cavity surface emitting lasers 39.

In current chemical vapor deposition epitaxial reactors, the substrate is typically at room temperature when it is loaded into the reaction chamber, which is still at a much higher temperature, perhaps as high as 900° C. When the substrate is dropped onto the susceptor, both substrate and susceptor experience thermal shock. As its mass is so much less than the susceptor's, the substrate's shock is more significant. The thermal effect experienced by the substrate usually varies throughout the extent of the substrate, that is to say that there are large thermal gradients, which may be difficult to mitigate. This can lead to substrate warping and breakage and also to poor uniformity and quality of deposited films.

The susceptor also experiences thermal shock, which is repeated with substrate after substrate, and can ultimately reduce the working lifetime of the susceptor. Usually the susceptor is prepared to receive a substrate by cooling to a temperature much less than the process temperature in order to reduce the thermal shock. Then, once the substrate is in place, the susceptor must be reheated to the process temperature before processing can proceed. This repeated temperature cycling, solely for the purpose of substrate transfer, slows substrate throughput in the apparatus.

There is a clear need for a method of substrate exchange in high temperature reaction chambers that reduces the thermal shock experienced by both the substrate and the susceptor without adversely affecting process throughput, and instead enhancing throughput. Therefore it may be advantageously to provide the vertical cavity surface emitting laser in the apparatus as a heater and/or a preheater.

The heater may comprise a pre-heater for pre-heating the substrates and a final heater to heat the substrates at a final temperature. A substrate handler for moving the substrate from the pre-heater to the final heater may be provided. The vertical cavity surface emitting lasers may be constructed and arranged to emit radiation to the substrates in the pre-heater to pre-heat the substrate prior to or during transfer of the substrate to the reaction chamber. The thermal shock experienced by both the substrate and the susceptor may thereby be decreased without adversely affecting process throughput, and instead enhancing throughput.

For single substrate apparatus lower temperature applications may be as relevant as relatively high temperature applications. At relatively high temperature the transfer of heat is easier and at low temperature the transfer of heat is slower. So it may be true that the temperature effect of a cold wafer coming in at low temperature is less but in absolute degrees Celsius it may be more difficult to control this lower temperature.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub combinations of the various processes, systems, and configurations, and other features, functions, acts, and/or properties disclosed herein, as well as any and all equivalents thereof.

What is claimed is:

1. An apparatus for manufacturing a semiconductor device comprising:
   a reaction chamber provided with a substrate holder for holding a substrate; and,
   a heater for heating the substrate; wherein the heater comprises a vertical cavity surface emitting laser constructed and arranged to emit a radiation beam to a substrate in the apparatus,
   wherein the substrate holder is a substrate rack for holding a plurality of semiconductor substrates in a spaced apart relationship, the substrate rack comprising at least one support member defining a plurality of spaced apart substrate holding provisions, each of which substrate holding provisions is configured to independently hold a substrate in a substantially horizontal orientation and the vertical cavity surface emitting laser is constructed and arranged to emit radiation to the substrates in the substrate rack at least from a side of the substrate rack.

2. The apparatus according to claim 1, wherein the heater comprises multiple vertical cavity surface emitting lasers provided in an array to emit multiple radiation beams in the direction of the substrate.

3. The apparatus according to claim 2, wherein the apparatus comprises a power controller to individually control the power of the individual vertical cavity surface emitting lasers in the array to individually control the power of each radiation beam.

4. The apparatus according to claim 2, wherein the array of vertical cavity surface emitting lasers are constructed and arranged to heat the substrates to a temperature between 50 and 1200° C.

5. The apparatus according to claim 2, wherein the array of vertical cavity surface emitting lasers for emitting radiation in the direction of the substrate has a power output density between 10 W/cm$^2$-40 kW/cm$^2$.

6. The apparatus according to claim 1, wherein the vertical cavity surface emitting laser emits infrared radiation with a wavelength between 800 nm and 1100 nm.

7. The apparatus according to claim 1, wherein the apparatus is provided with a substrate rack rotating device constructed and arranged to rotate the substrate rack.

8. The apparatus according to claim 1, wherein the vertical cavity surface emitting laser is constructed and arranged to emit the radiation beam from the side of the substrate rack upwards towards a bottom of the substrates held in the substrate rack under an angle between 60 to 90° with respect to a line perpendicular to the surface of the substrate.

9. The apparatus according to claim 1, wherein the apparatus is provided with reflectors constructed and arranged within the apparatus on the other side of the substrate rack with respect to the vertical cavity surface emitting laser to reflect radiation reflected of the substrates back to the substrate rack.

10. The apparatus according to claim 9, wherein the reflectors comprise retroreflectors to reflect the radiation beam back in the same direction as from which the radiation beam came.

11. The apparatus according to claim 1, wherein the apparatus comprises multiple vertical cavity surface emitting lasers and a power controller to individually control the power of the individual vertical cavity surface emitting lasers to adjust a radiation output of the vertical cavity surface emitting lasers along the substrate rack.

12. The apparatus according to claim 11, wherein the power controller is programmed to provide a higher radiation output with the vertical cavity surface emitting lasers at the top and the bottom of the substrate rack.

13. The apparatus according to claim 1, wherein the heater comprises a pre-heater for pre-heating the substrates and a final heater to heat the substrates at a final temperature and a rack handler for moving the rack from the pre-heater to the final heater and the vertical cavity surface emitting lasers to emit radiation to the substrates in the substrate rack are provided to the pre-heater.

14. The apparatus according to claim 13, wherein the pre-heater and the final heater are provided in the reaction area.

15. The apparatus according to claim 14, wherein the pre-heater is constructed and arranged below the final heater and the rack handler can move the rack upwards to the final heater.

16. The apparatus according to claim 13, wherein the rack handler and the pre-heater are constructed and arranged to move the rack along the pre-heater while the pre-heater is heating a portion of the substrates in the rack.

17. The apparatus according to claim 14, wherein the pre-heater has length in the vertical direction which is less than the length of the rack in the vertical direction.

18. An apparatus for manufacturing a semiconductor device comprising:
   a reaction chamber provided with a substrate holder for holding a substrate; and,
   a heater for heating the substrate; wherein the heater comprises a vertical cavity surface emitting laser constructed and arranged to emit a radiation beam to a substrate in the apparatus, wherein the heater comprises a pre-heater to pre-heat the substrate and a final heater to heat the substrate at a final temperature and a substrate handler for moving the substrate from the pre-heater to the final heater and the vertical cavity surface emitting lasers to emit radiation to the substrate is provided in the pre-heater.

19. The apparatus according to claim 18, wherein the vertical cavity surface emitting laser is provided in a substrate handling chamber.

20. The apparatus according to claim 1, wherein the vertical cavity surface emitting laser may be constructed and arranged to heat a substrate in the reaction chamber.

21. The apparatus according to claim 20, wherein the reaction chamber is provided with a chamber wall transmissive for the radiation of the vertical cavity surface emitting laser.

22. The apparatus according to claim 21, wherein the chamber wall is made from a material transmissive to the radiation of the vertical cavity surface emitting laser.

23. A method for producing a semiconductor device, comprising:
   providing an apparatus for manufacturing a semiconductor device comprising:
   a reaction chamber provided with a substrate holder for holding a substrate; and,
   a heater for heating the substrate; wherein the heater comprises a vertical cavity surface emitting laser constructed and arranged to emit a radiation beam to a substrate in the apparatus,
   wherein the substrate holder is a substrate rack for holding a plurality of semiconductor substrates in a spaced apart relationship, the substrate rack comprising at least one support member defining a plurality of spaced apart substrate holding provisions, each of which substrate holding provisions is configured to independently hold a substrate in a substantially horizontal orientation and the vertical cavity surface emitting laser is constructed and arranged to emit radiation to the substrates in the substrate rack at least from a side of the substrate rack;
   providing a substrate; and
   heating the substrate with the vertical cavity surface emitting laser.

\* \* \* \* \*